(12) United States Patent
Lamble

(10) Patent No.: US 12,239,983 B2
(45) Date of Patent: Mar. 4, 2025

(54) HEATERS FOR MEDICAL DEVICES

(71) Applicant: Sense Biodetection Limited, Abingdon (GB)

(72) Inventor: Ralph Lamble, Abingdon (GB)

(73) Assignee: Sense Biodetection Limited, Abington (GB)

( * ) Notice: Subject to any disclaimer, the term of this patent is extended or adjusted under 35 U.S.C. 154(b) by 0 days.

(21) Appl. No.: 18/020,692

(22) PCT Filed: Aug. 26, 2021

(86) PCT No.: PCT/GB2021/052213
§ 371 (c)(1),
(2) Date: Feb. 10, 2023

(87) PCT Pub. No.: WO2022/043689
PCT Pub. Date: Mar. 3, 2022

(65) Prior Publication Data
US 2023/0262872 A1    Aug. 17, 2023

(30) Foreign Application Priority Data

Aug. 26, 2020 (GB) .................................. 2013353
Aug. 26, 2020 (GB) .................................. 2013354
(Continued)

(51) Int. Cl.
*H05K 1/02* (2006.01)
*B01L 3/00* (2006.01)
(Continued)

(52) U.S. Cl.
CPC ....... *B01L 3/502761* (2013.01); *B01L 3/5023* (2013.01); *B01L 3/50273* (2013.01);
(Continued)

(58) Field of Classification Search
CPC .................................................... H05K 1/0212
See application file for complete search history.

(56) References Cited

U.S. PATENT DOCUMENTS 6,781,056 B1    8/2004   O'Rourke et al.
2008/0154179 A1 *  6/2008   Cantor .................. A61M 37/00
                                                       604/20
(Continued)

FOREIGN PATENT DOCUMENTS

WO   WO 2009/140373 A2   11/2009
WO   WO-2014/164933 A1   10/2014
(Continued)

OTHER PUBLICATIONS

International Search Report & Written Opinion PCT Application No. PCT/GB2021/052213, dated Nov. 5, 2021, 11 pages.
(Continued)

*Primary Examiner* — Sherman Ng
(74) *Attorney, Agent, or Firm* — Choate, Hall & Stewart LLP; Michael L. Vetter; Peter A. Flynn

(57) ABSTRACT

A medical device comprising a multilayer printed circuit board (PCB) comprising a heating element on an inner layer of the PCB; a single cell electrical power source to power the heating element; and a chamber adapted to contain a liquid, at least part of said chamber being defined by a thermally conductive material configured to provide a thermal transfer interface between the chamber and the PCB.

19 Claims, 38 Drawing Sheets

(30) Foreign Application Priority Data

Aug. 26, 2020 (GB) ..................................... 2013356
Aug. 26, 2020 (GB) ..................................... 2013358

(51) Int. Cl.
  *B01L 7/00* (2006.01)
  *G01K 1/14* (2021.01)
  *H05K 7/20* (2006.01)

(52) U.S. Cl.
  CPC .................. *B01L 7/52* (2013.01); *G01K 1/14* (2013.01); *H05K 1/021* (2013.01); *H05K 1/0212* (2013.01); *H05K 7/2049* (2013.01); *B01L 2200/0621* (2013.01); *B01L 2200/0647* (2013.01); *B01L 2200/10* (2013.01); *B01L 2200/14* (2013.01); *B01L 2200/147* (2013.01); *B01L 2200/16* (2013.01); *B01L 2300/042* (2013.01); *B01L 2300/0636* (2013.01); *B01L 2300/0825* (2013.01); *B01L 2300/0861* (2013.01); *B01L 2300/12* (2013.01); *B01L 2300/1827* (2013.01); *B01L 2400/0406* (2013.01); *B01L 2400/0478* (2013.01); *B01L 2400/0633* (2013.01); *B01L 2400/0644* (2013.01)

(56) References Cited

U.S. PATENT DOCUMENTS

| | | | |
|---|---|---|---|
| 2010/0068822 A1* | 3/2010 | Heydenhauss | B01L 3/502738 436/172 |
| 2010/0304986 A1 | 12/2010 | Chen et al. | |
| 2013/0210080 A1 | 8/2013 | Rajagopal et al. | |
| 2016/0263577 A1 | 9/2016 | Ismagilov et al. | |
| 2016/0271342 A1* | 9/2016 | Bronkhorst | F24H 9/2028 |
| 2017/0219556 A1* | 8/2017 | Ciampini | G01N 33/48707 |
| 2017/0304829 A1* | 10/2017 | Andreyev | B01L 7/525 |
| 2018/0000158 A1* | 1/2018 | Ewing | A24F 40/485 |
| 2019/0299210 A1 | 10/2019 | Lemoine et al. | |
| 2020/0030795 A1 | 1/2020 | Pais et al. | |
| 2023/0256441 A1 | 8/2023 | Lamble | |
| 2023/0257834 A1 | 8/2023 | Lamble | |
| 2024/0033736 A1 | 2/2024 | Lamble | |

FOREIGN PATENT DOCUMENTS

| | | |
|---|---|---|
| WO | WO-2016/062788 A1 | 4/2016 |
| WO | WO-2017/093333 A1 | 6/2017 |
| WO | WO-2022/043689 A1 | 3/2022 |
| WO | WO-2022/043693 A1 | 3/2022 |
| WO | WO-2022/043696 A1 | 3/2022 |
| WO | WO-2022/043697 A1 | 3/2022 |

OTHER PUBLICATIONS

International Search Report for PCT/GB21/52213, 3 pages (mailed May 11, 2021).
International Search Report for PCT/GB21/52219, 3 pages (Apr. 22, 2021).
International Search Report for PCT/GB21/52223, 4 pages (mailed Mar. 21, 2021).
International Search Report for PCT/GB21/52224, 4 pages (mailed Dec. 2, 2021).
Written Opinion for PCT/GB21/52213, 5 pages (mailed May 11, 2021).
Written Opinion for PCT/GB21/52219, 5 pages (Apr. 22, 2021).
Written Opinion for PCT/GB21/52223, 7 pages (mailed Mar. 21, 2021).
Written Opinion for PCT/GB21/52224, 6 pages (mailed Dec. 2, 2021).

* cited by examiner

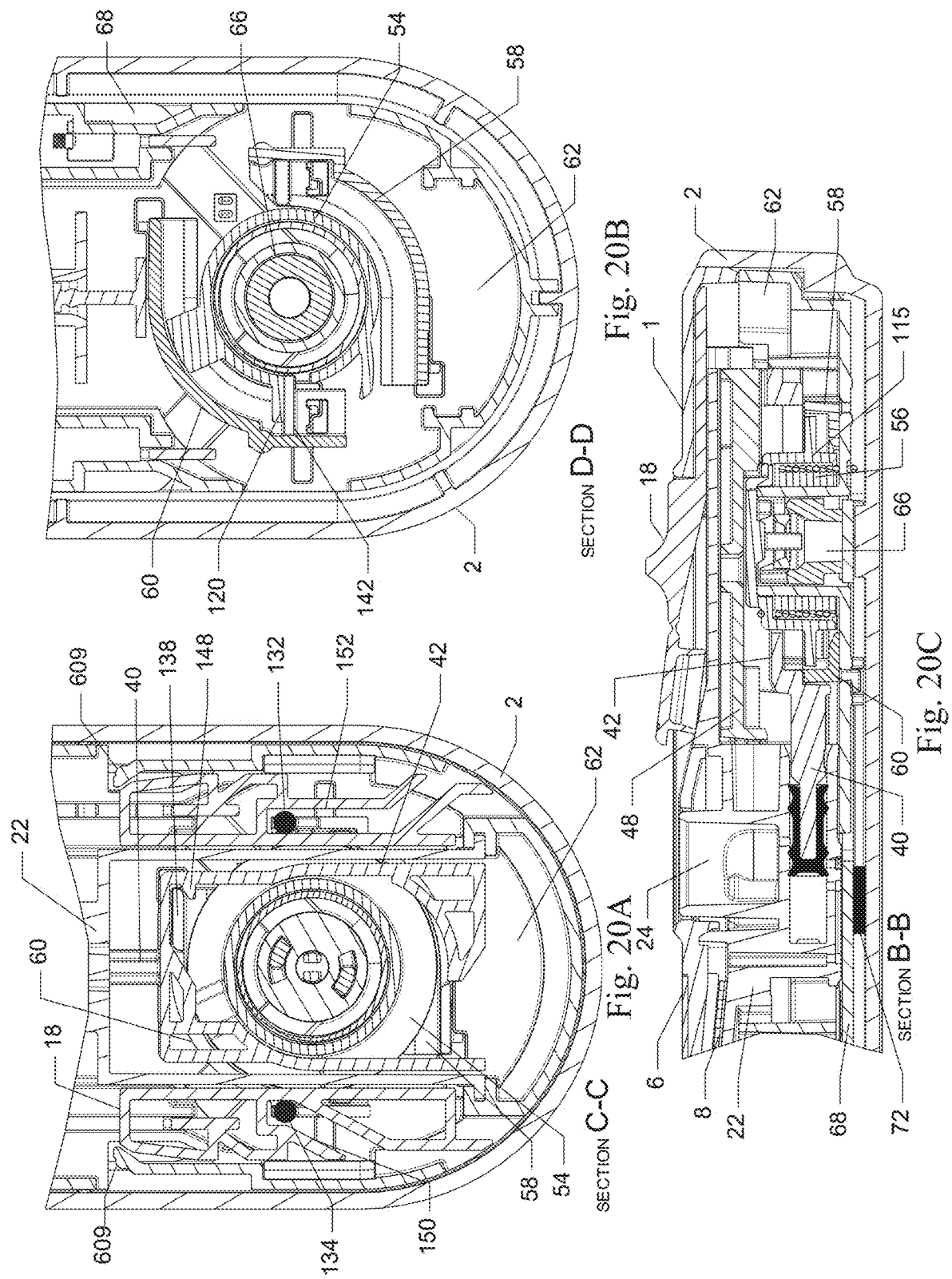

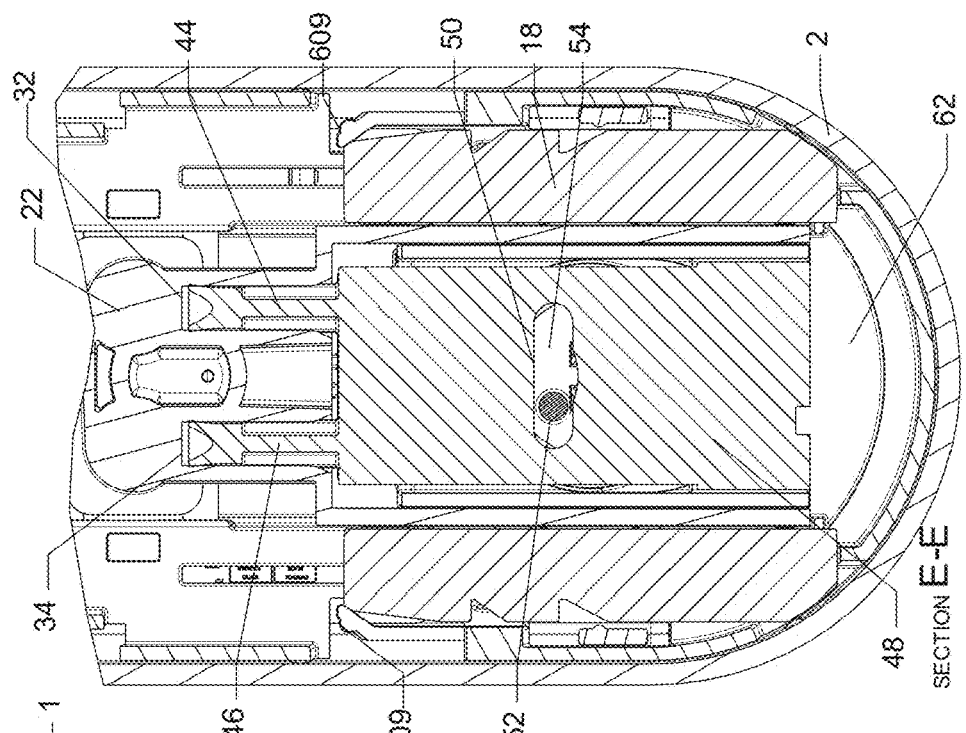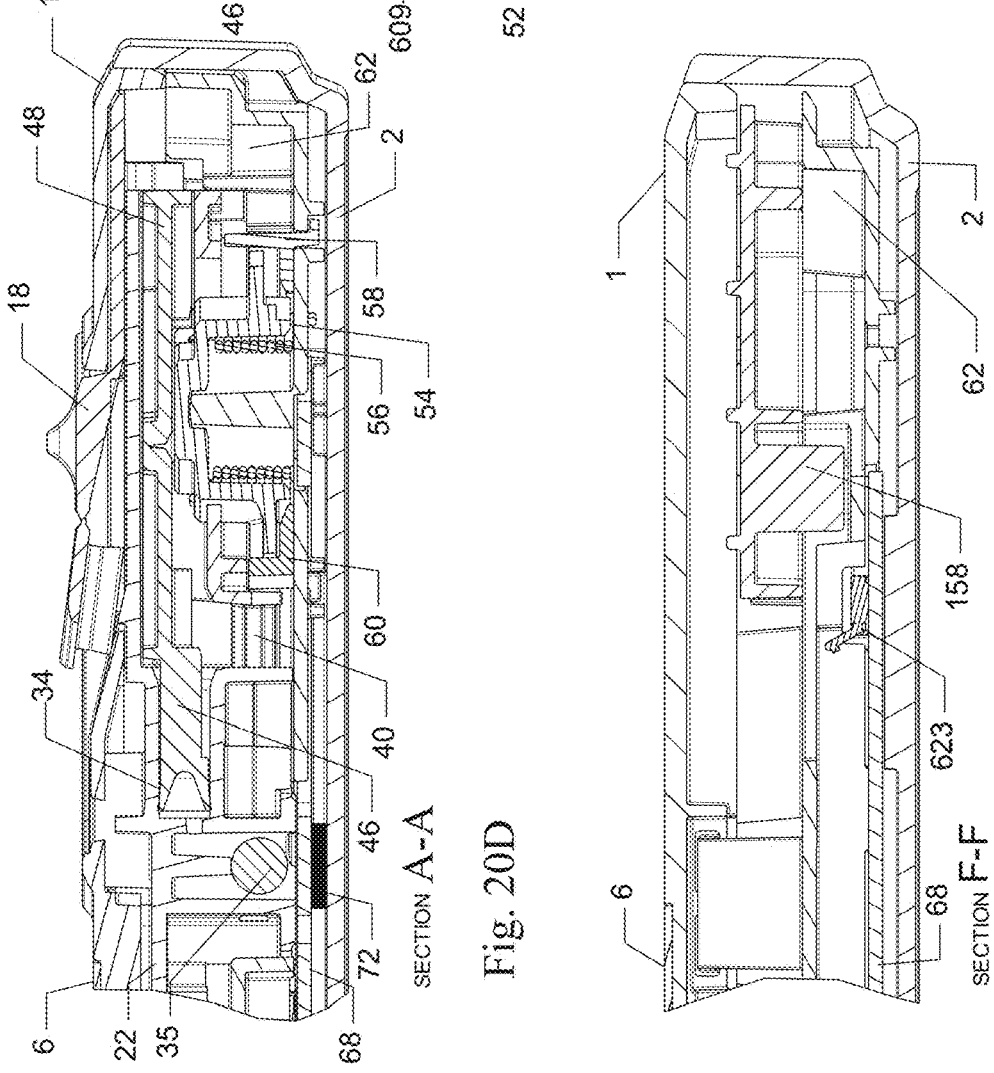

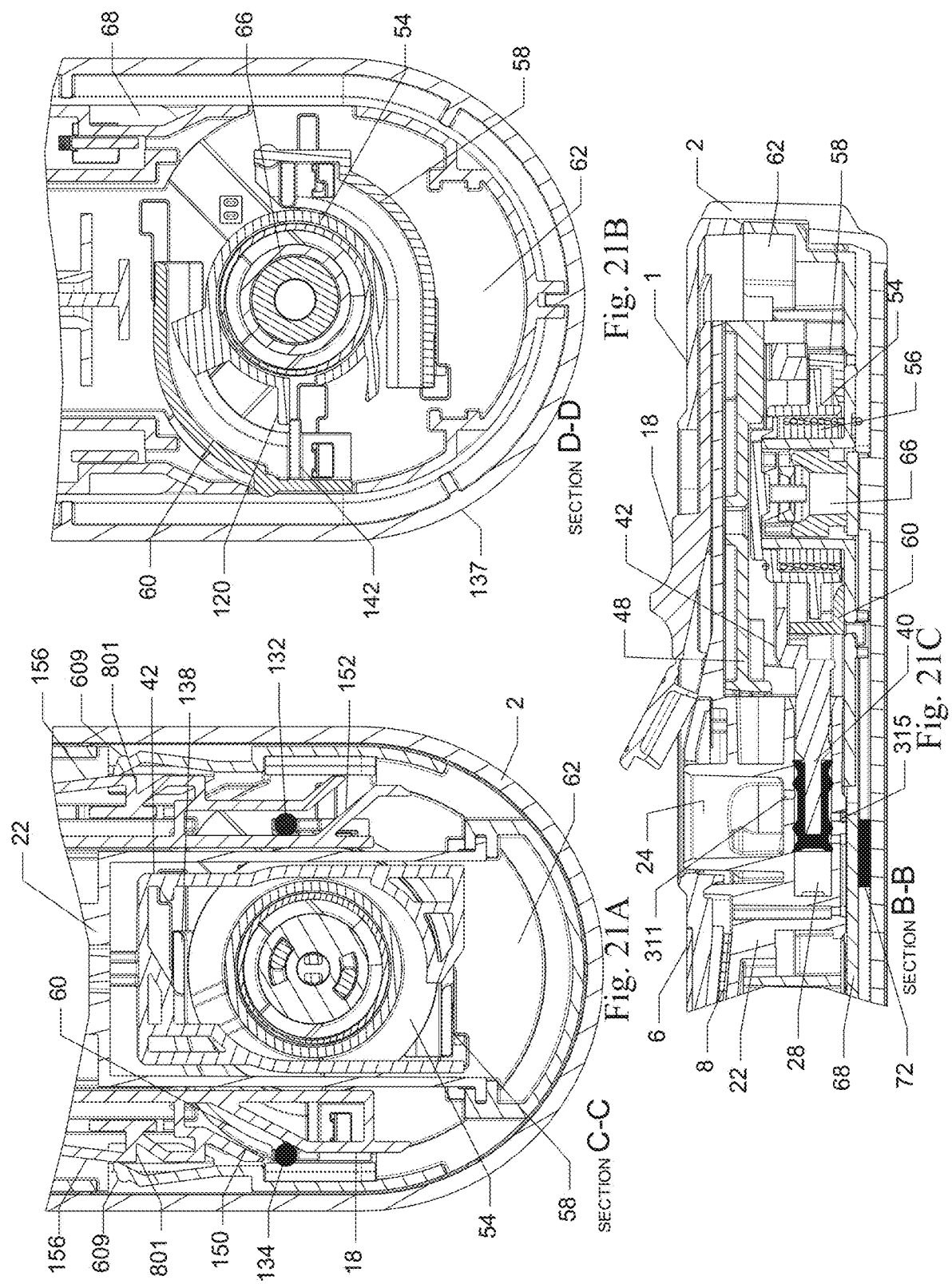

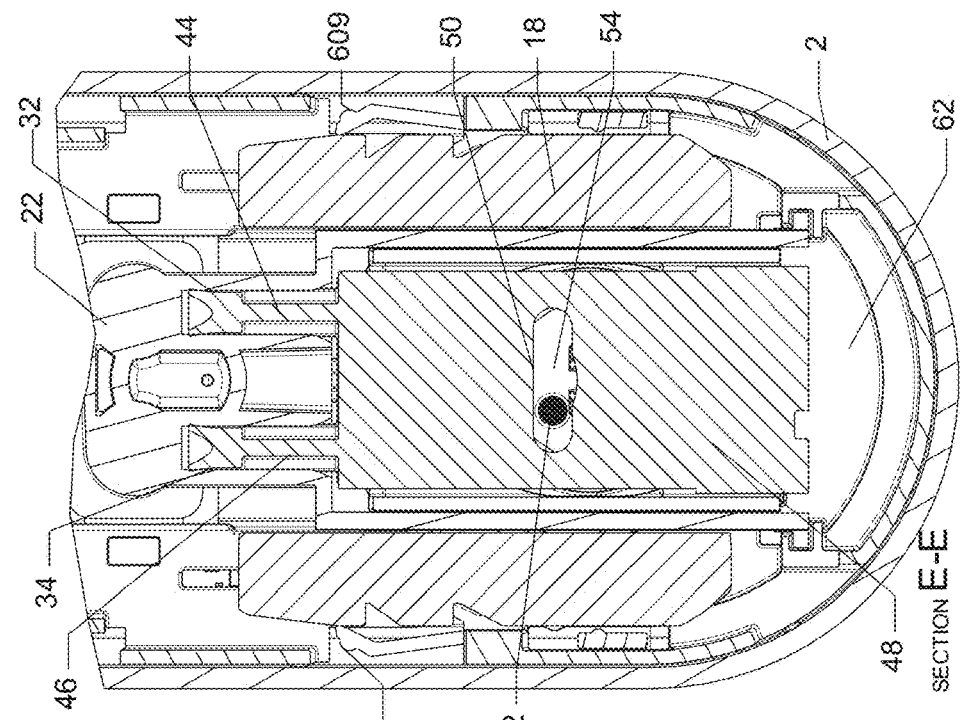
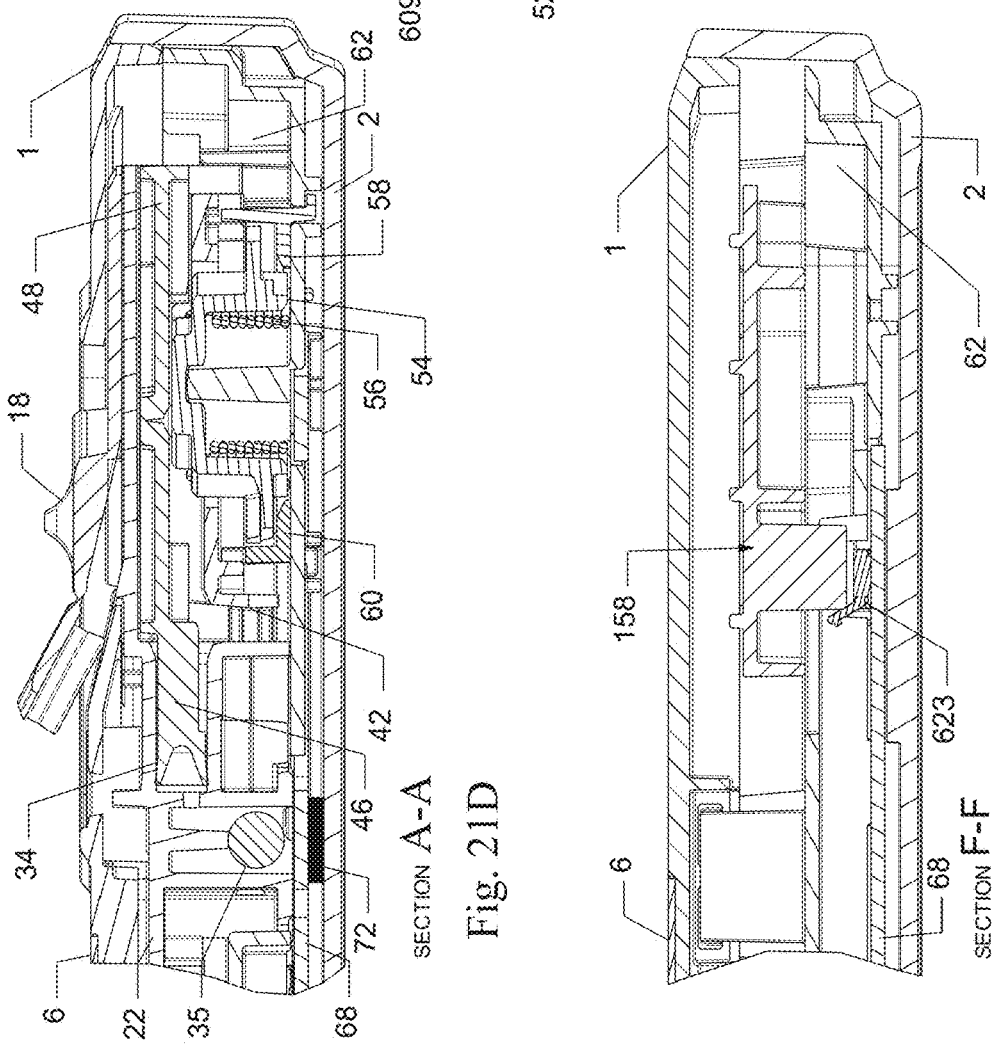

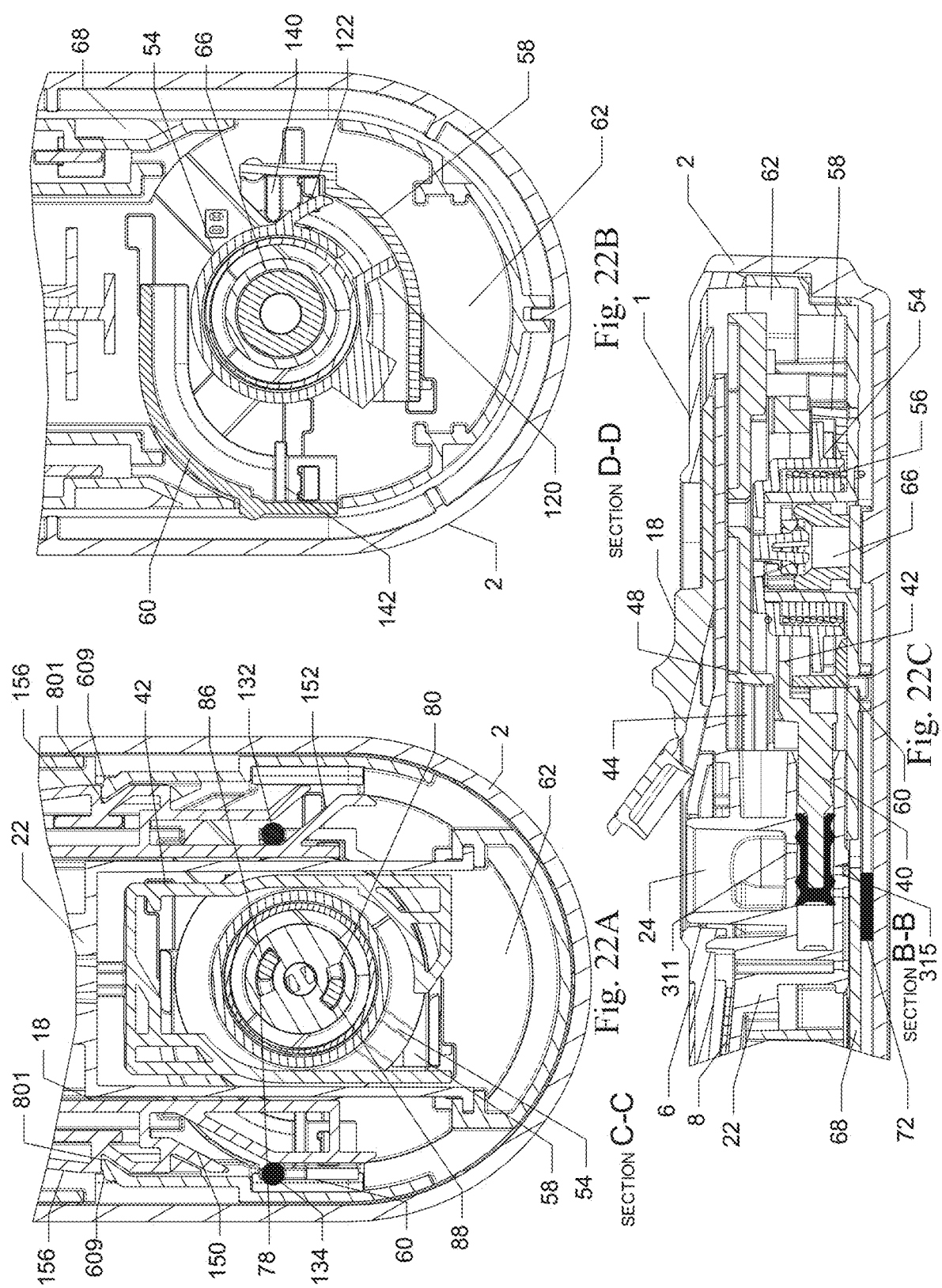

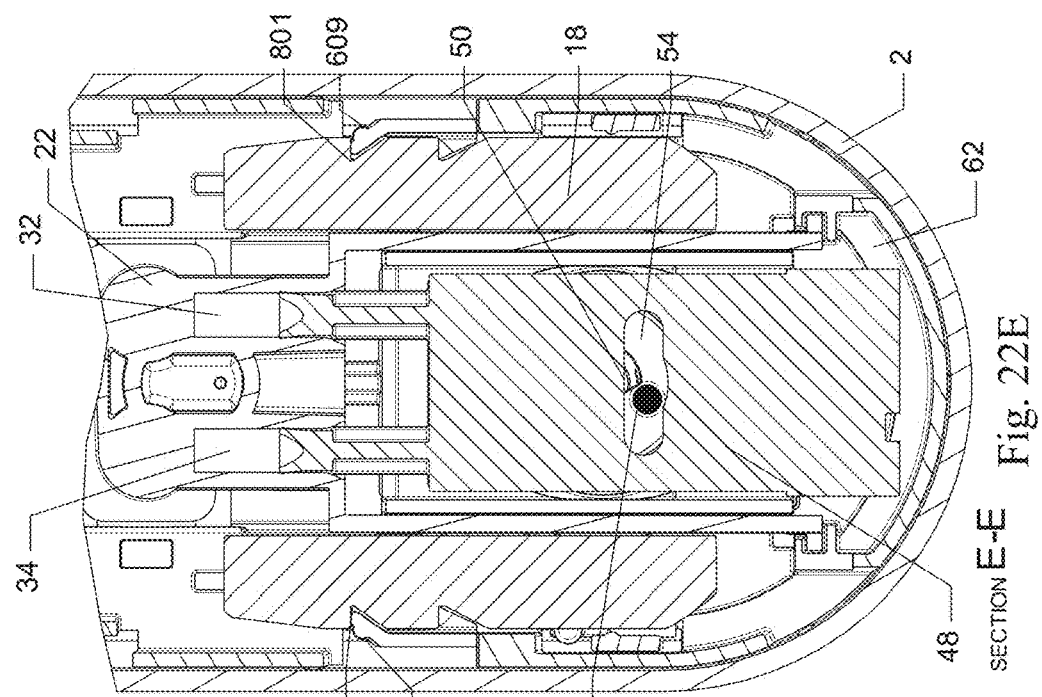
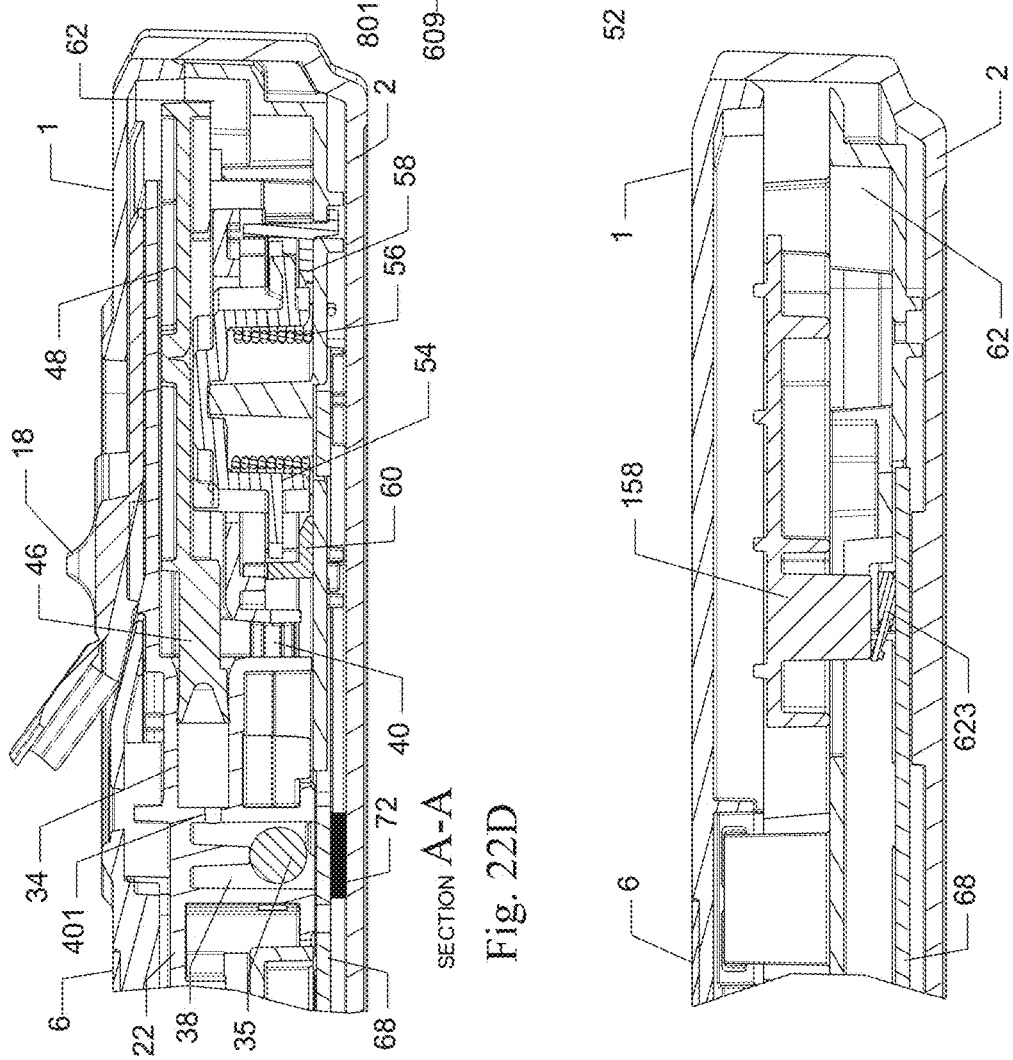
SECTION A-A
Fig. 22D
SECTION E-E
Fig. 22E
SECTION F-F
Fig. 22F

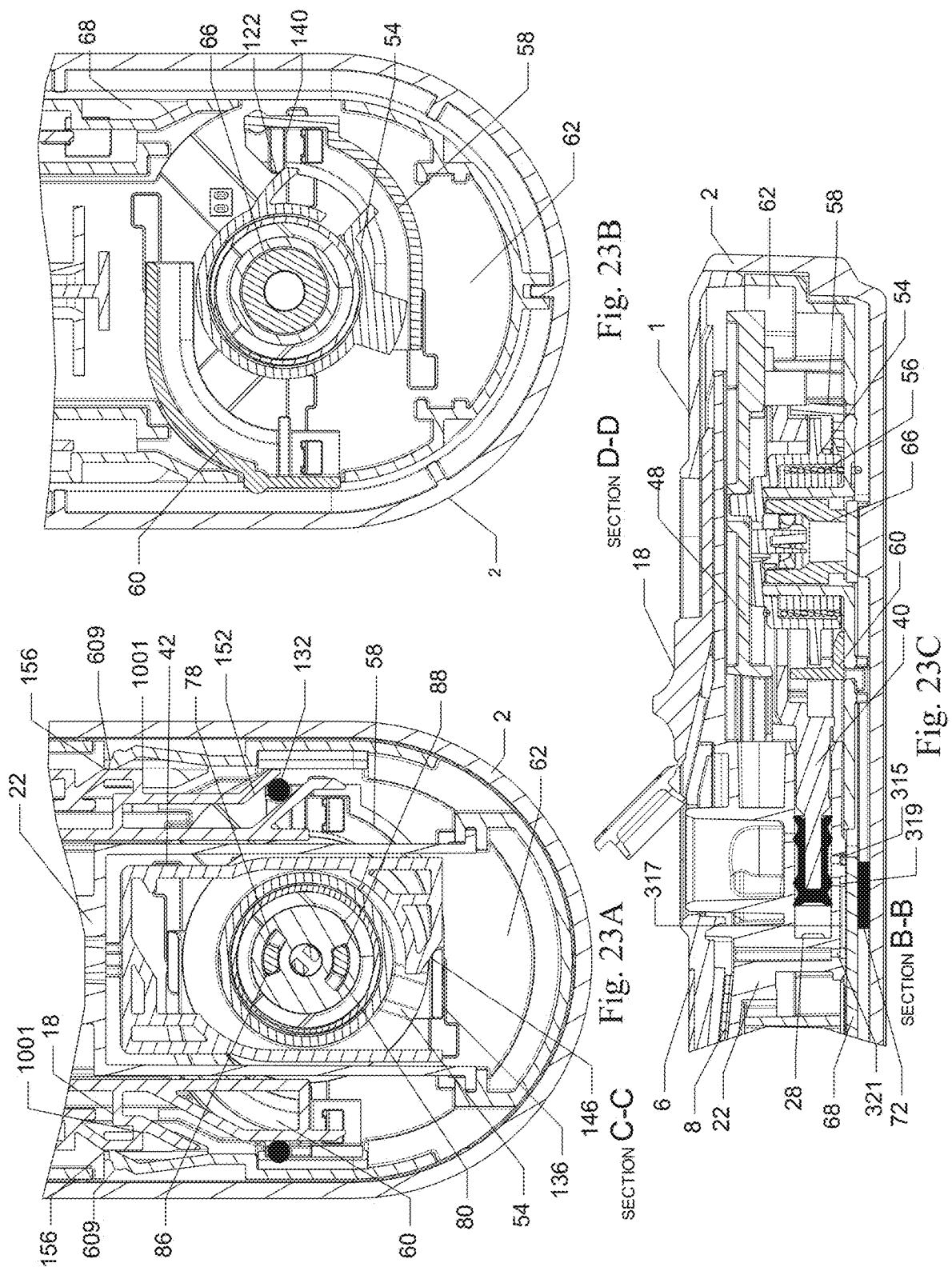

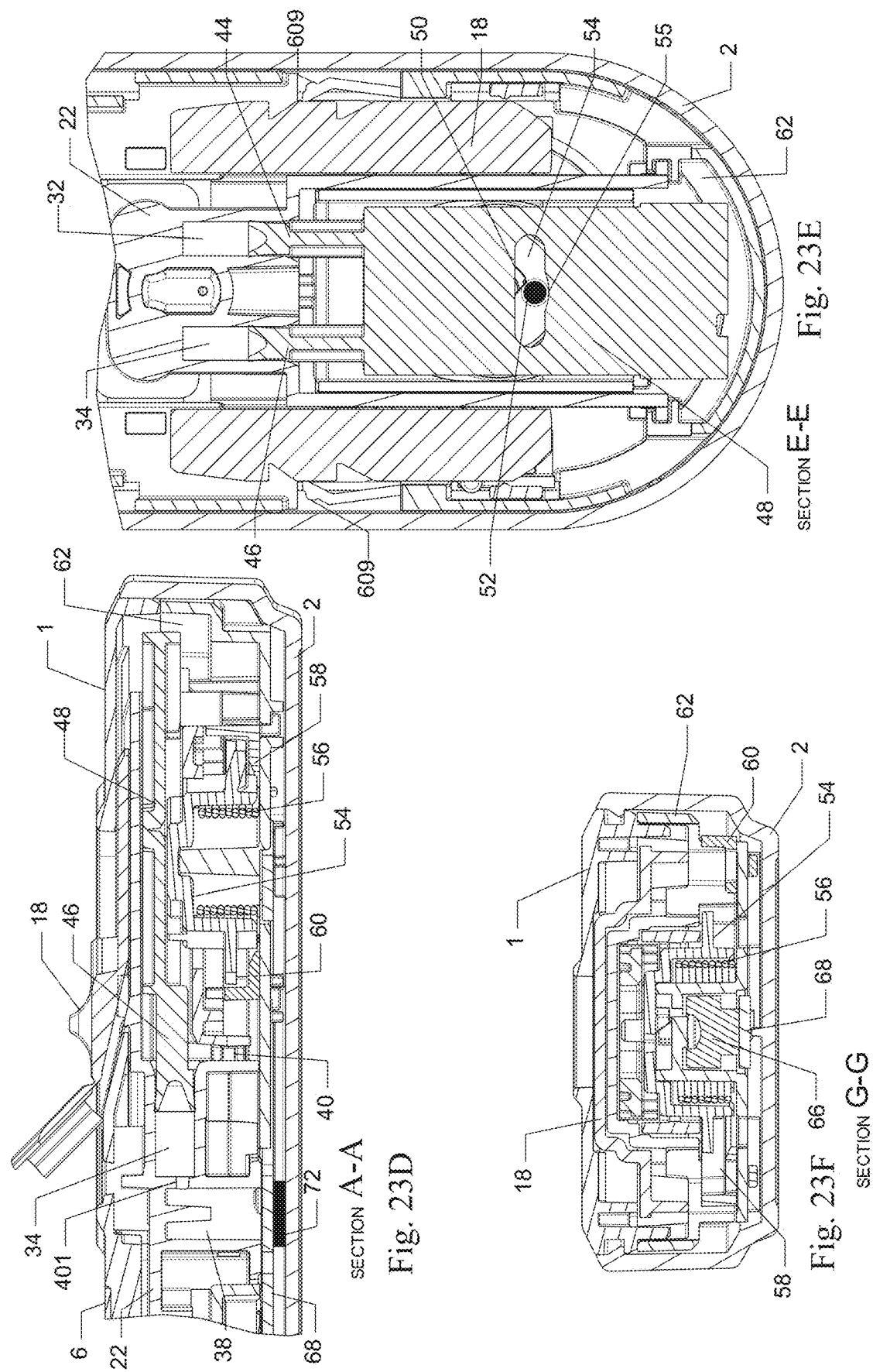

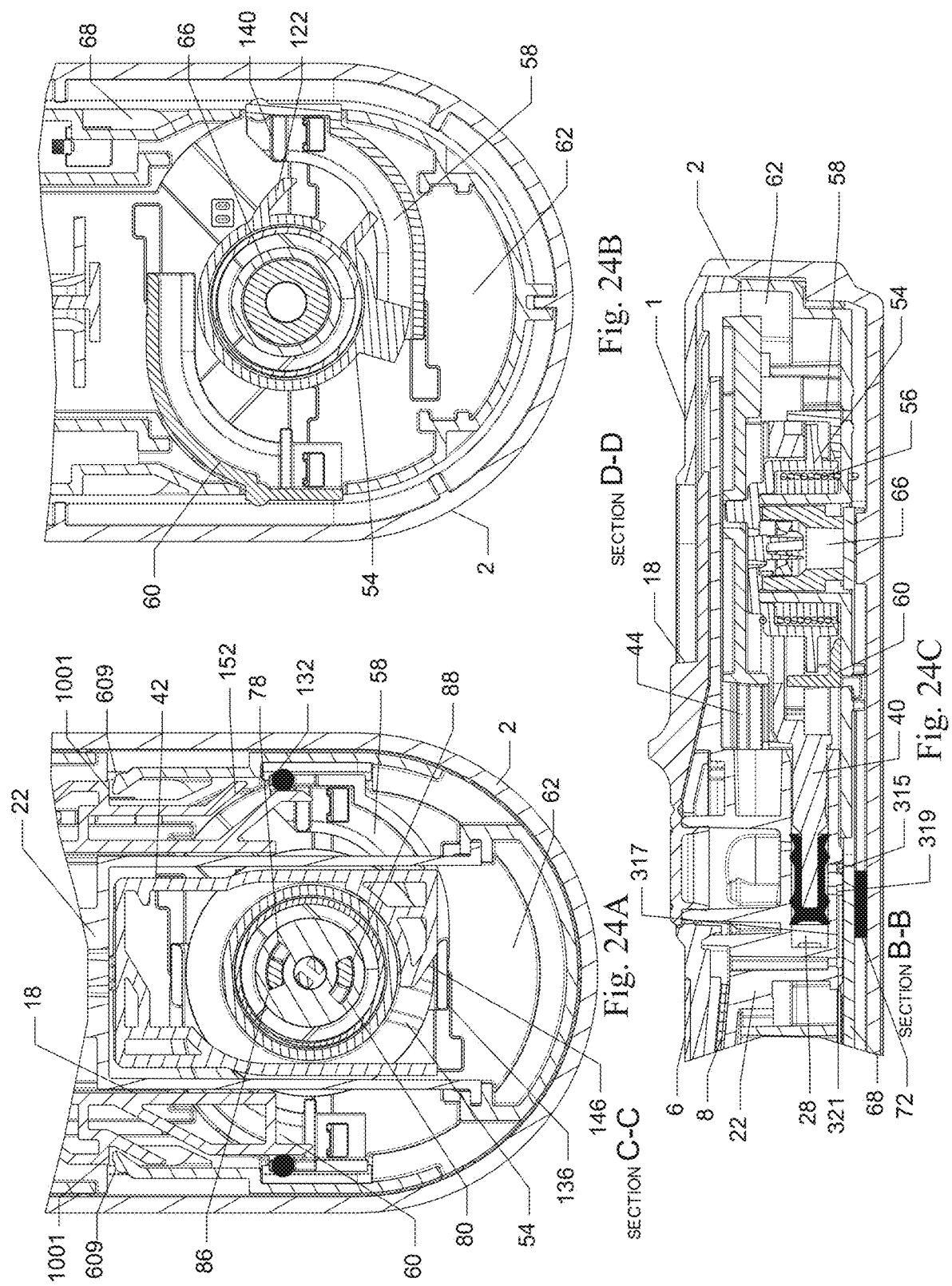

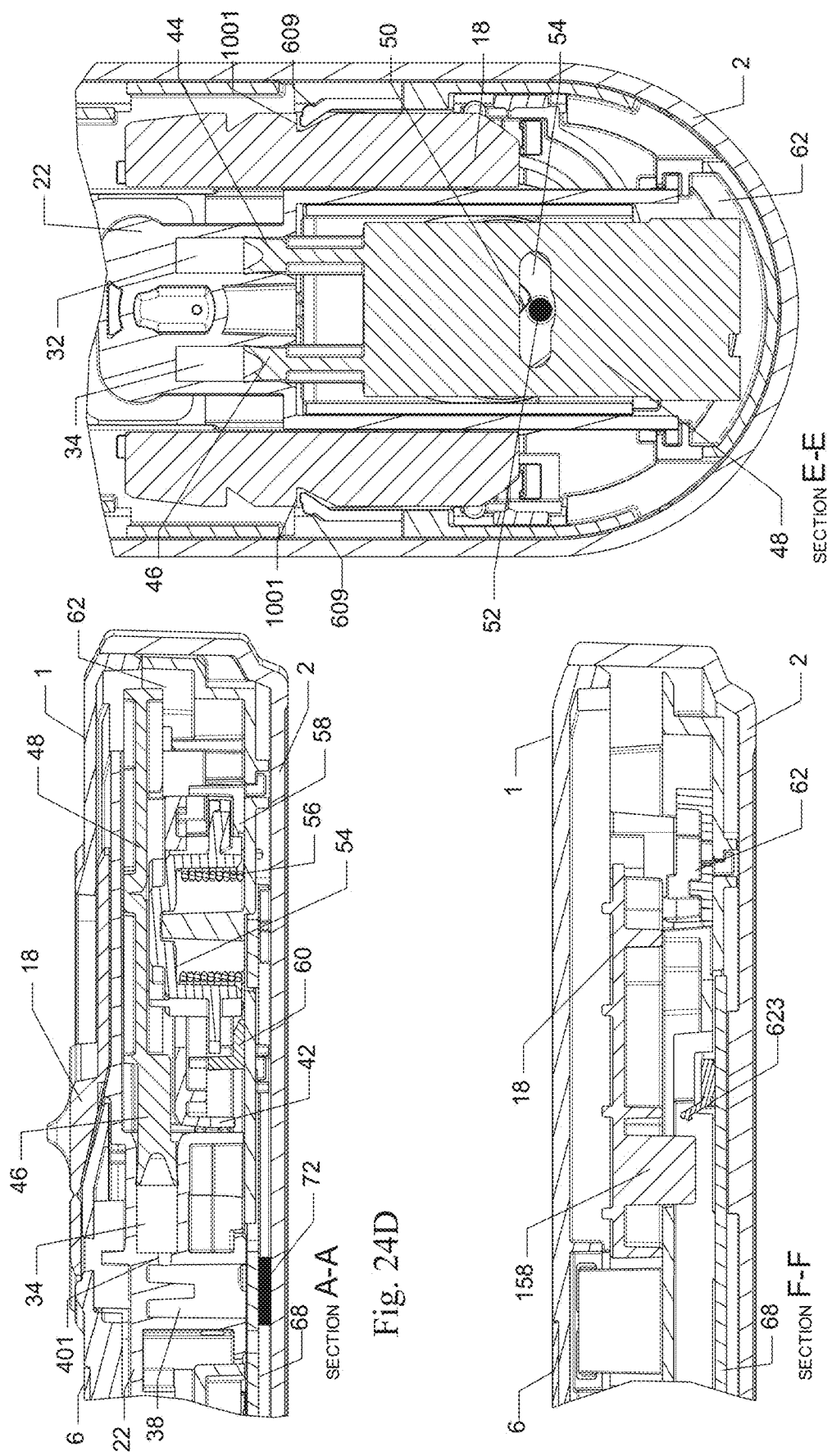

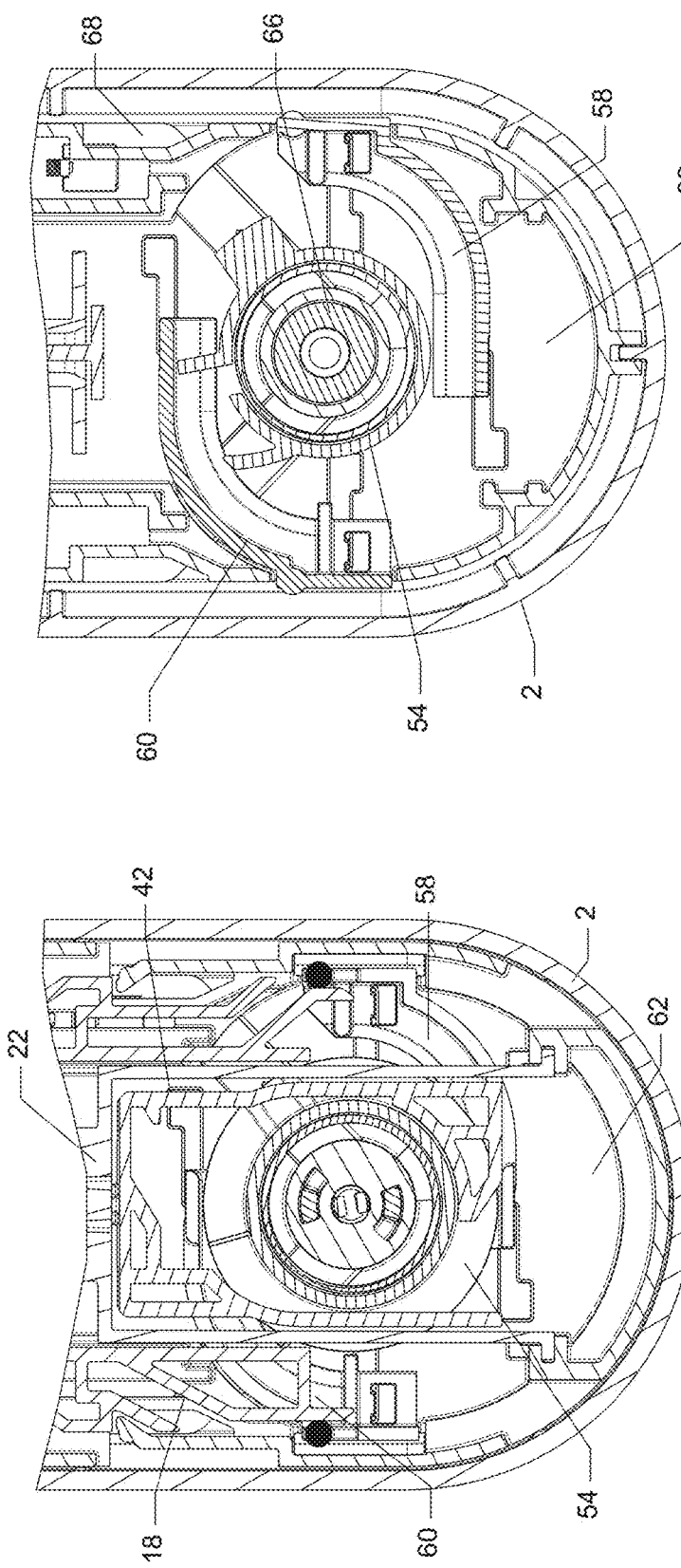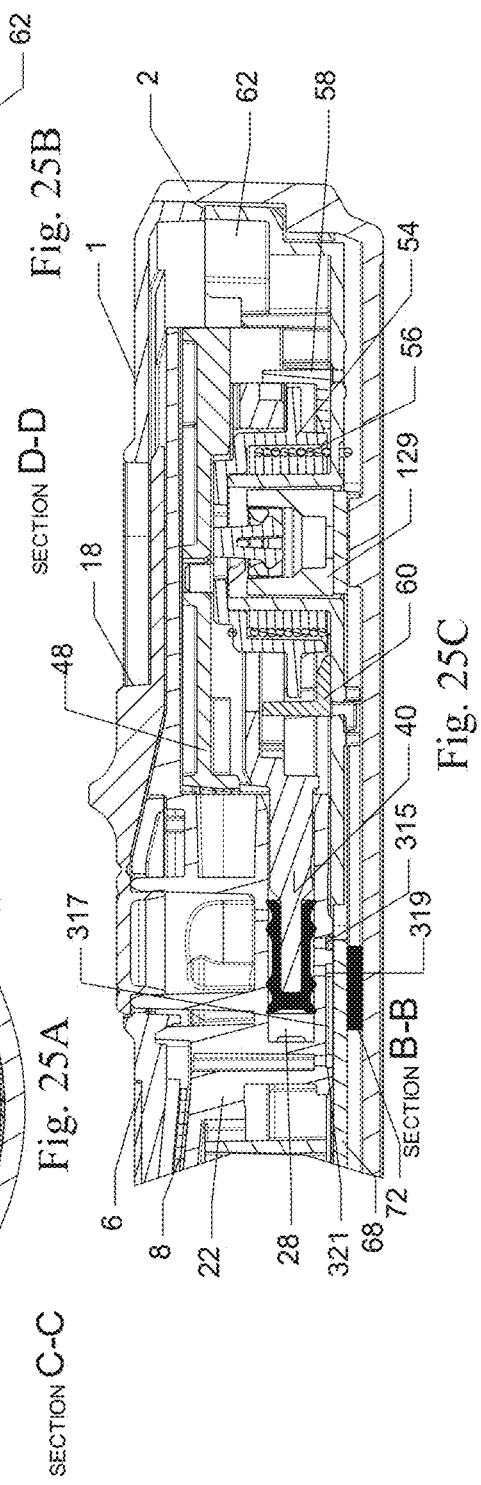

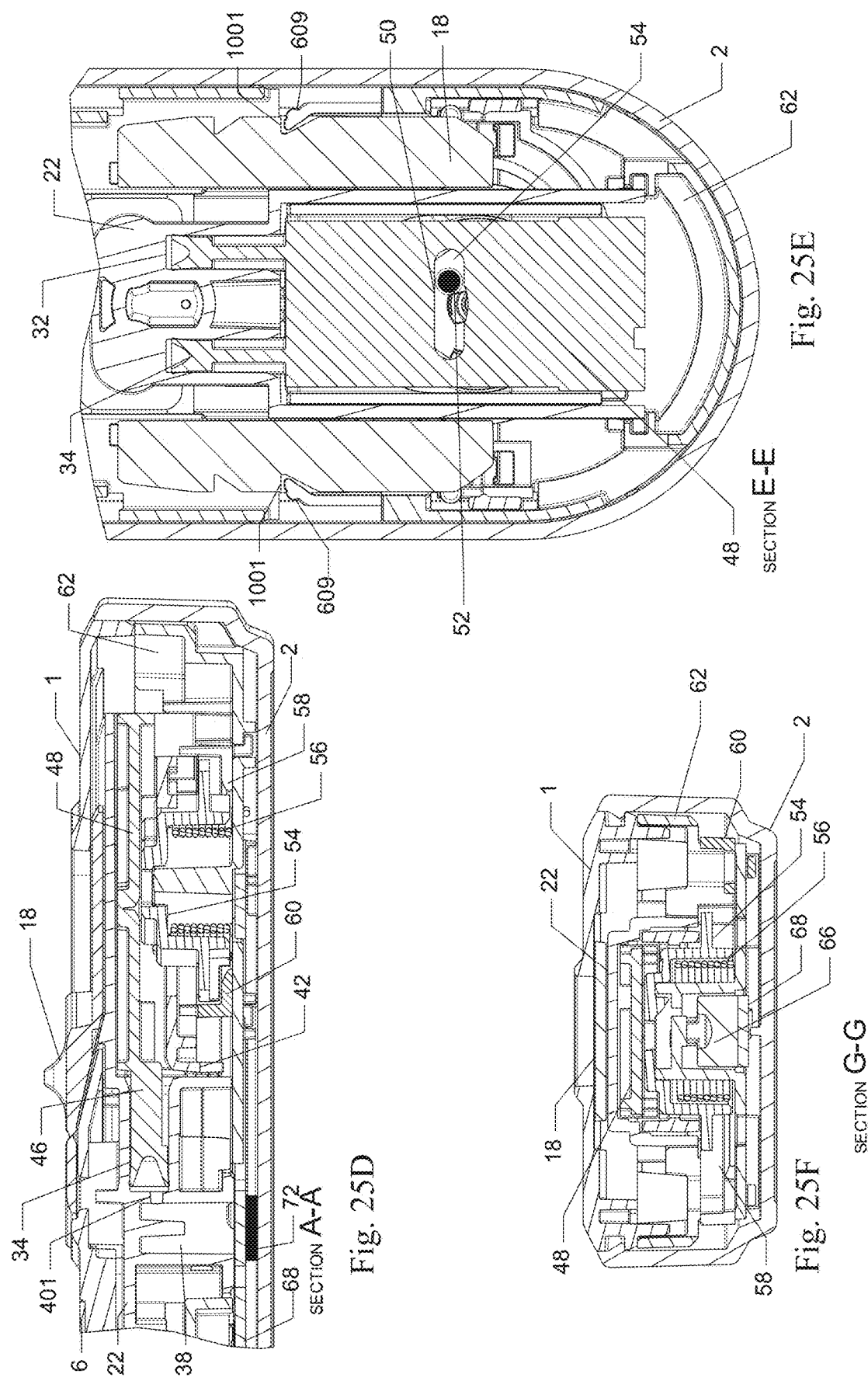

SECTION I-I

SECTION H-H

SECTION L-L

SECTION J-J

HEATERS FOR MEDICAL DEVICES

CROSS-REFERENCE TO RELATED APPLICATIONS

The present application is a 371 National Stage entry of International Application No. PCT/GB2021/052213, filed on Aug. 26, 2021, which claims priority to United Kingdom (GB) Application Nos. 2013353.4, 2013354.2, 2013356.7, and 2013358.3, each of which were filed on Aug. 26, 2020, the entire contents of each of which are hereby incorporated by reference in their entireties.

FIELD OF THE INVENTION

This invention relates to a device for use in biological analysis and diagnostics and to heaters for use in medical devices.

BACKGROUND TO THE INVENTION

The invention is particularly, but not exclusively, applicable to the analysis of a biological sample, for example to detect a biomolecule in a sample, such as a nucleic acid biomarker by a method that involves nucleic acid amplification and/or a protein biomarker by a method that involves an immunoassay and/or a small molecule biomarker by a method that involves an enzymatic reaction.

Such methods typically involve mixing a liquid sample that may contain one or more biomolecules, with one or more reagents, allowing the sample then to undergo one or more types of reaction under controlled temperature conditions and then determining the presence or otherwise of the biomolecule(s) by detecting the signal produced in said reaction(s). This type of multi-step analysis is conventionally conducted using large, expensive, bench mounted, pieces of laboratory apparatus, operated by specially trained laboratory technicians. Such procedures generally require the transportation of a biological sample, taken for example, from a patient, to a central laboratory for processing. This can result in significant delays in obtaining diagnostic test results so that appropriate action can be taken through e.g. prescription of suitable medication to the patient. There is thus a significant need for point of care, or even at home, methods for rapidly obtaining diagnostic test results. Previous attempts to obtain point of care testing have resulted in devices which still require for example an external power supply and/or must be operated by trained technicians and/or require a user to perform multiple steps, often at prescribed time points, in order for the device to complete the test. Such devices are also generally not self-contained in that they comprise a multi-use processing base station, which for example performs any necessary reactions and detection steps in an analysis, into which are inserted disposable sample containing cartridges.

The present invention overcomes the deficiencies of known diagnostic methods by providing a device which can rapidly provide true point of care diagnosis without the need for an external power supply and which through the use of a mechanically powered drive means rather than relying e.g. on electrically driven motors, can be made small enough to be hand-held and cheaply enough to function as a single use, disposable diagnostic device. The device is also self-contained in that it can perform all the necessary steps to conduct an analysis and requires minimal user intervention.

SUMMARY OF THE INVENTION

A device for use in the analysis of a biomolecule in a liquid sample by a procedure having at least two stages, the device having a plurality of zones for accommodating at least part of the liquid sample at different stages of the procedure, transfer means for transferring at least part of the liquid sample from one to another of said zones along a respective flow path, wherein the device includes mechanically powered drive means for operating the transfer means.

The device may to advantage include flow control means for selectively opening one or more flow paths between the zones and a common actuating member which sequentially controls both the mechanically powered drive means and the flow control means. The common actuating member is preferably manually operated by a user.

The use of mechanically powered drive means enables the device to be of a relatively cheap and simple construction, avoiding, for example, the need for an electromechanical arrangement, such as a motor or solenoid in the drive means. The use of a common actuating member means that a user does not need to operate multiple features of the device, thus simplifying its use.

There is provided a device for use in the analysis of a biomolecule in a liquid sample, the device having a plurality of zones for accommodating at least part of the liquid sample, transfer means for transferring at least part of the liquid sample from one to another of said zones along a respective flow path, mechanically powered drive means for operating the transfer means, flow control means for selectively opening one or more of flow path between the zones, and a common actuating member which sequentially controls both the mechanically powered drive means and the flow control means to achieve transfer of at least part of the liquid sample between said zones.

There is provided a device for use in the analysis of a biomolecule in a liquid sample, the device having at least three zones for accommodating at least part of the liquid sample, transfer means for transferring at least part of the liquid sample from a first zone to a second zone and for subsequently transferring at least part of the liquid sample from the second zone to a third zone along respective flow paths, a mechanically powered driver for operating the transfer means, a flow controller for selectively opening the flow paths between the zones, and a manually-operated common actuating member movable between a first and a second position to sequentially control both the mechanically powered driver and the flow controller to achieve transfer of at least part of the liquid sample between said zones, in which movement of the manually-operated common actuating member from the first position to the second position acts on the mechanically powered driver to achieve transfer of at least part of the liquid sample from the first zone to the second zone, and in which the mechanically powered driver effects the subsequent transfer of at least part of the liquid sample from the second zone to the third zone independently of the movement of the manually-operated common actuating member.

A device which performs the transfer of at least part of the liquid sample from a second zone to a third zone independently of the movement of the common actuating member offers significant advantages over devices which require multiple control input steps by the user in order for the device to perform an analysis. The independence of this second transfer means that it can also be performed independently in terms of time from the first transfer. Thus the device may be arranged and configured to effect the transfer of at least part of the liquid sample from the second zone to the third zone a predetermined time after the transfer of at least part of the liquid sample from the first zone to the second zone.

The device may further comprise a timed release mechanism which is actuated by the movement of the manually-operated actuating member from the first position to the second position to trigger the transfer of at least part of the liquid sample from the second zone to the third zone a predetermined time after the manually-operated actuating member has moved to the second position from the first position. The mechanically powered driver may comprise a store of energy, such as a mechanical energy store, which is released by the timed release mechanism to be free to move the mechanically powered driver so as to effect the transfer of at least part of the liquid sample from the second zone to the third zone.

Preferably, the mechanically powered drive means (or driver), includes a mechanical energy store such as biasing means for storing mechanical energy for powering the drive means. The biasing means may, for example, be a gas spring, but is preferably a mechanical spring such as a torsion spring. Other energy stores may be utilised in addition to or instead of those with elastic potential, such as chemical or magnetic energy stores.

The biasing means may be loaded by the user initiating the operation of the device, for example by moving an actuating member to cause the transfer means to move the sample between zones for one stage of the operation, the thus loaded biasing means subsequently providing the power for operating the transfer means to cause the transfer of part of the sample to another zone for a further, subsequent stage of the procedure. Preferably, however, the biasing means is preloaded to simplify operation. Consequently, the drive means is able to work more consistently on the transfer means (i.e. deliver energy consistently) than is done solely by the user operating the device, for example using a user actuating member such as a button, knob or slider directly coupled to the transfer means. This enables the transfer means to operate repeatably independent of the user.

The mechanically powered drive means may comprise a rotary member. Preferably, the drive means comprises a rotary member on which the biasing means acts, and is operable to cause the transfer means to perform one or more transfers of at least part of the liquid sample between zones.

The transfer means may be a transfer pump, such as a reciprocating piston pump. Preferably, the transfer means has a displacement member which is linearly movable, the rotary member being coupled to the transfer means by a linkage which converts rotational movement of the rotary member into linear movement, e.g. reciprocating linear movement, of the displacement member, to cause said one or more liquid transfers under the power of the drive means. The displacement member may comprise at least one piston but preferably, may comprise multiple pistons each movable in a respective cylindrical piston chamber.

Preferably, the energy store of the mechanically powered drive means, such as a biasing means, is preloaded with sufficient energy to cause movement of the displacement member along two, opposite linear strokes.

Preferably, the flow control means comprises a valve. Conveniently, the valve includes a rod linearly movable in a valve chamber to bring selective pairs of ports into fluid communication, so as to create said selected flow paths.

The device may comprise three or more, for example three, zones for accommodating at least part of the liquid sample at different stages of the procedure. Alternatively, the device may comprise two zones for accommodating at least part of the liquid sample at different stages of the procedure. The plurality of zones may comprise, e.g. as a first zone, a sample receiving means through which the sample is introduced into the device, e.g as a second zone, a reaction chamber in which the sample undergoes one or more reactions specific to the analysis and, e.g. as a third zone, a test region for subsequently analysing the reacted sample. The device may also comprise a mixing chamber, e.g. for mixing reagents with a liquid sample. The sample receiving means may comprise a sample receiving chamber and the device may include a cap or cover for closing the sample receiving chamber during the operation of the device. The common actuating member may comprise the cap or cover for closing the sample receiving chamber.

It is to be understood that a single zone within a device of the invention may perform one or more functions, such as those described above. Thus, for example, a sample chamber may also function as a reaction chamber, and a reaction chamber may also function as a test region e.g. when analysis of a sample is performed in real time during a reaction.

The device is preferably provided pre-loaded with reagents for performing any reactions or detection steps performed in the analysis. For example, for the detection of a nucleic acid involving nucleic acid sequence amplification, reagents may include, without limitation, oligonucleotide primer(s), oligonucleotide probe(s), polymerase(s), reverse transcriptase(s), restriction enzyme(s), dye(s), additive(s), excipient(s), buffer salt(s) and/or metal ion chelator(s). The nucleic acid sequence of the oligonucleotide primers/oligonucleotide probes would be determined based upon the sequence of the relevant nucleic acid that is to be targeted by the intended use of the device. For the detection of a protein biomarker using an immunoassay, reagents may include one or more antibody or protein affinity bioreagent and/or dye. Reagents may be provided in solution but are preferably provided in dry form e.g. in the form of lyophilised beads.

The device may be a single use or one-shot, device and may be disposable. The device may be configured such that it can only be used once. It may be a diagnostic device and may for example be used for the diagnosis or monitoring of a disease or diseased state, for example the diagnosis of an infectious disease such as by detecting a pathogen associated biomolecule.

The device may to advantage include retaining means for temporarily interrupting the operation of the drive means so as to delay the completion of the operation of the transfer means for a controlled period. Such retaining means may be used in a device which performs the transfer of at least part of the liquid sample from a second zone to a third zone independently of the movement of the common actuating member. Thus the operation of the transfer means can be paused while, for example, the sample is being processed in a reaction chamber, and the drive means is then allowed to cause the transfer means to transfer the sample to a test region with or preferably without the need for any additional control input from the user. The period of interruption may be predetermined. The period of interruption may be timed from another event occurring during the operation of the device, without limitation, such event could, for example, be the actuation of a sensor during the movement of a common actuating member or a temperature sensor measuring a defined temperature e.g. associated with the temperature in a reaction chamber. Preferably, the retaining means comprises a thermoplastic retaining member, such as a thermoplastic retaining member comprising a catch, for engaging with, and acting as a stop to the drive means and a heating member for heating said retaining member, causing the latter to soften (or melt), so as to release the drive means therefrom after said period. The thermoplastic retaining member preferably has at least one engagement surface configured to engage with and act as a stop to the drive means e.g. by engaging with a latch member provided on the drive means.

Thermoplastic retaining members releasable by heating, have utility beyond that in the devices as described above and may advantageously be used in other situations where, for example, it is desirable to prevent or temporarily halt a resiliently biased latch member.

Thus, according to a further aspect there is provided a device comprising:
- a resiliently biased latch member;
- a thermoplastic retaining member having at least one engagement surface configured to engage with and act as a stop to the latch member; and
- a heating member positioned in proximity to with the thermoplastic retaining member,
- wherein activation of the heating member softens at least a portion of the thermoplastic retaining member to release the latch member.

The device may be a medical device, such as a diagnostic test device.

The release of the latch member may release stored mechanical energy, for example stored mechanical energy in a preloaded biasing means such as a mechanical spring, e.g. a torsion spring. Release of the latch member may activate a drive means for example to cause a drive means to transfer a liquid, e.g. transfer a liquid between different zones in the device and/or transfer liquid out of the device, such as an injector.

The thermoplastic retaining member may also be configured to engage with a casing or chassis element of the device.

In all of the devices described herein the engagement surface of the thermoplastic retaining member may be sloped such that the engagement between the engagement surface and the drive means or latch member presses the thermoplastic retaining member towards the heating member. The drive means or latch member may comprise a sloped engagement surface such that the engagement between the engagement surface of the thermoplastic retaining member and the drive means or latch member presses the thermoplastic retaining member towards the heating member.

A thermoplastic retaining member preferably has a melting temperature of between 40° C. and 150° C., e.g. about 70° C. The thermoplastic retaining member may comprise a thermoplastic material with a low softening temperature such as polycaprolactone or a cyclic/cyclo olefin polymer or copolymer.

The heating member for the thermoplastic retaining member may be an electrical heater, for example it may be an element of a printed circuit board (PCB). A device comprising such a heating member may also have a temperature sensor in thermal contact with the PCB. The heating member may be in direct or indirect thermal contact with the thermoplastic retaining member.

A device may be configured to soften (or melt) the thermoplastic retaining member and thereby release the latch member after a controlled period, e.g. a predetermined time after the engagement of the retaining member and drive means or latch member, or other period as described above.

Returning now to the device for use in the analysis of a biomolecule in a liquid sample, because the transfer means is powered by the drive means, an initial movement of the actuating member can both activate the device and cause it subsequently to transfer the sample between zones (for example after the sample has been processed in a reaction chamber), without the need for subsequent manipulation of the actuating member.

Preferably, the actuating member is movable along a single actuating member stroke, the device being arranged for this movement to cause the device to perform a predetermined sequence of operations to achieve said analysis of the sample. The actuating member may be movable, to perform said stroke, along an arc, but is preferably mounted to move linearly on the device.

The device may to advantage include a detent that resists movement of the actuating member beyond a position part way along said stroke, at which point there is a flow path established between the sample receiving zone and the reaction chamber and the operation of the transfer means to transfer the sample into the reaction chamber has been triggered, but before the position in which a flow path between the reaction chamber and the test region is established by the flow control means. This prompts the user to pause movement of the actuating member, in order to give the transfer means sufficient time to transfer the sample from the sample receiving means to the reaction chamber before the transfer means is reconfigured to provide a flow path from the reaction chamber to the test region. The detent may be configured directly on the drive means or directly on the actuator.

Preferably, the sequence of operations comprises the transfer of at least part of the liquid sample from a sample receiving means to a reaction chamber, along a flow path through the flow control means, whereupon it undergoes one or more reactions and subsequently transferring reacted sample from the reaction chamber to a test region, along another flow path through the flow control means.

The device may to advantage have one or more heaters e.g. thermally coupled to one or more zones of the device, for example to a reaction chamber and/or sample chamber, and the analysis may include the step of heating the sample in said one or more zones, e.g. chamber(s). The device may also have one or more heaters to soften a thermoplastic retaining member as described above. In some embodiments heating in the device does not involve temperature cycling.

Preferably, the heater(s) is an electrical heater, for example provided as an element of a printed circuit board (PCB). The device may include biasing means for urging the heater e.g. the PCB, against a thermally conductive surface, e.g. wall, defining the relevant zone(s), e.g. a reaction chamber.

Electrical power for the device, for example to power heaters and any other electrical functionality such as timers, positional sensors, temperature sensors and visual indications to a user such as LED lights, may be provided by one or more batteries or cells. Because the device comprises mechanically powered drive means the electrical requirements are much lower than in known devices, as such the device of the invention does not require an external power source and can function with a single battery such as a single AAA alkaline or AAA lithium battery.

PCB mounted electrical heaters as described above have utility beyond that in the device as described herein and may advantageously be used in other situations where, for example, efficient heating of liquid is required in a medical device, in particular where the PCB also carries control electronics for additional functionality within the device in which the heating of the liquid is performed.

Thus according to a further aspect there is provided a medical device comprising:

a chamber adapted to contain a liquid, at least part of said chamber being defined by a thermally conductive material; and a multilayer printed circuit board (PCB) comprising a heater;

wherein the thermally conductive material forms an interface between the chamber and the PCB.

The device may also comprise, or be adapted to contain an electrical power source, such as a battery, to power the heating element. It may be a single cell power source such as a AAA battery In a further aspect there is provided a medical device comprising:

a multilayer printed circuit board (PCB) comprising a heating element on an inner layer of the PCB; and a single cell electrical power source to power the heating element;

a chamber adapted to contain a liquid, at least part of said chamber being defined by a thermally conductive material configured to provide a thermal transfer interface between the chamber and the PCB.

The single cell power source is preferably the only power source that powers the heater. Such a device may be supplied without the single cell power source in situ allowing e.g. a user to insert it prior to using the device. In this case the device will not comprise the single cell power source but will be adapted to contain a single cell power source.

The single cell electrical power source may be a single cell battery such as an AAA alkaline or AAA lithium battery.

The heater or heating element is preferably a resistance based heater, it may comprise a trace coil, e.g. a copper trace coil. The trace coil may be any suitable shape, for example serpentine or spirals. The heater or heating element may be on at least one inner layer of the PCB, which in principle would be expected to result in reduced heat transfer compared to, for example, having heater coils positioned on an outer/top board layer of the PCB, but in fact allows for improved control of the coil resistance because the inner layers are not electroplated whereas outer layers are electroplated which makes them more variable. This therefore allows the internal resistance of an electrical power source such as a battery or cell (which in the case of an AAA alkaline battery would be about 0.4 to 1.5Ω) to be closely matched in order to ensure maximum power transfer i.e. the device can be more closely tuned, which results in improved performance and allows the use of a lower-power electrical power source, thereby reducing manufacturing costs. Therefore, the electrical resistance of the PCB heater or heating element may be substantially the same as the internal electrical resistance of the power source. For example, the electrical resistance of the heater or heating element is not substantially lower than the maximum internal resistance of the single cell electrical power source. The electrical resistance of the PCB heater or heating element may be substantially the same as the internal electrical resistance of the power source. The electrical resistance of the PCB heater or heating element and the internal electrical resistance of the power source may both be about 0.4 to 1.5Ω, or both be less than 1Ω, The thermally conductive material may be a sheet of thermally conductive material, such as a foil, for example a metallic foil, e.g. aluminium foil. The thermally conductive material may be bonded to and act as a seal to an opening in the chamber. The chamber may comprise at least one substantially planar surface which is defined by the thermally conductive material. The interface between the thermally conductive material and the PCB may have a larger surface area than the area of the of the chamber defined by the thermally conductive material, e.g. the heater and the thermally conductive material may extend beyond the part of the chamber defined by the thermally conductive material.

The medical device may further comprise a temperature sensor, e.g. thermally coupled to the chamber. The temperature sensor may be located on the PCB and a thermally conductive element, e.g. a copper pad, may thermally couple the temperature sensor to the thermally conductive material, e.g. to the underside of a foil. The temperature sensor may advantageously be positioned on PCB in proximity to the chamber, this arrangement allows a close approximation of the temperature of the liquid in the reaction chamber to be determined without requiring a temperature sensor to be positioned within the liquid or using a heat block both of which would be impractical and expensive in for example a disposable device.

The medical device may further comprise a temperature controller, such as Proportional Integral (PI) or Proportional Integral Derivative (PID) controller.

The medical device may further comprise biasing means to urge the PCB into contact with the thermally conductive material. The biasing means, e.g. a foam pad, may be located between the PCB and a device casing within which the chamber and the PCB are housed; or the biasing means may form an integral part of the device casing.

The medical device may comprise a plurality of chambers at least part of each of which is defined by a thermally conductive material. The thermally conductive material defining at least part of a plurality of chambers may be continuous between the plurality of chambers.

The chamber may be a reaction chamber such as a nucleic acid, e.g. isothermal nucleic acid, amplification reaction chamber or a medicament chamber. The chamber may be a flow-through chamber.

The medical device may be a diagnostic test device, such as device for use in the analysis of a biomolecule in a liquid sample as described elsewhere herein, or a medical delivery device such an injector or infuser in which pre-heating of a liquid, e.g. a drug substance, is required prior to delivery to a patient. The medical device may be a one-shot or single use, disposable device.

The invention also provides the use of a device according to the invention for analysing a biomolecule in a liquid sample, and a method for analysing a biomolecule in a liquid sample comprising introducing the liquid sample into a device according to the invention and actuating the drive means e.g. via a common actuating member.

BRIEF DESCRIPTION OF THE DRAWINGS

The invention will now be described, by way of example only, with reference to the accompanying drawings in which:

FIGS. 20A-20F are sectional views, respectively along the lines C-C, D-D, B-B, A-A, E-E and F-F of FIG. 15, when the lid is in its first position;

FIGS. 21A-21F correspond to FIGS. 20A-20F respectively, but show the device when the lid has been moved to a second position;

FIGS. 22A-22F correspond to FIGS. 21A-21F respectively, but show the device when the lid has been moved to a third position;

FIGS. 23A-23E correspond to FIGS. 22A-22E respectively and FIG. 23F corresponds to FIG. 22G, and show the device when the lid is in a fourth position;

FIGS. 24A-24G respectively correspond to FIGS. 22A-22G, but show the device when the lid is in a fifth position;

FIGS. 25A-25I are sectional views along the lines C-C, D-D, B-B, A-A, E-E, G-G, I-I, H-H and L-L respectively of FIG. 15 showing the device when the lid is still in the fifth position, but after a predetermined time has passed, and the thermoplastic retaining member or catch shown in FIG. 12 has partially melted;

DETAILED DESCRIPTION

Figure 1:
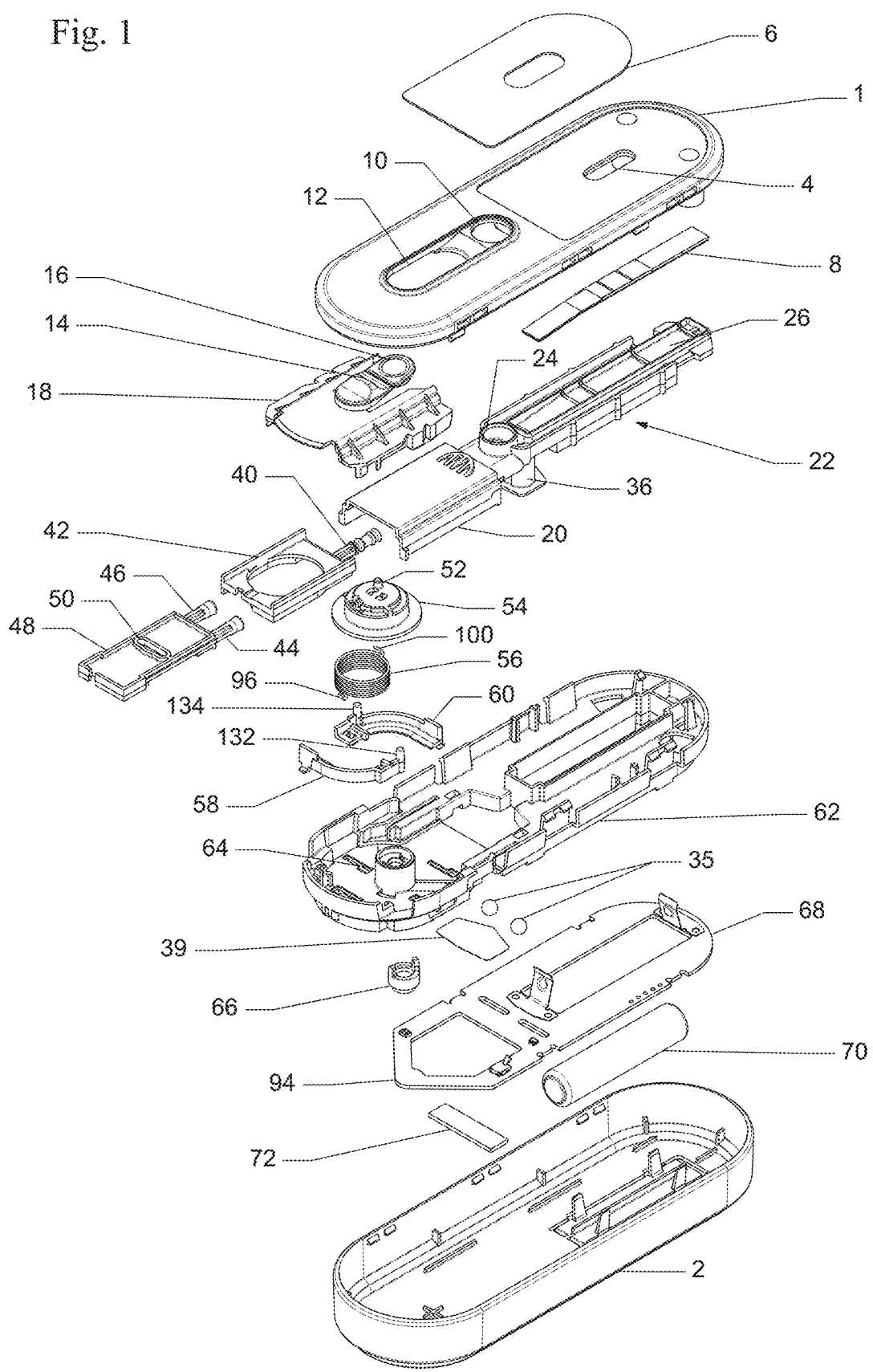
FIG. 1 is an exploded isometric view, from above and one side, of a device in accordance with the invention.

The embodiment of device according to the invention as shown in the drawings is a single use, i.e. one-shot, device for use in analysing a liquid sample by an analysis method which involves nucleic acid amplification and/or an immunoassay. The analysis may, without limitation, be performed for the purpose of detecting the presence of a pathogen and/or for the diagnosis, prophylaxis or monitoring of a disease or a diseased state, such as an infectious disease or cancer. The liquid sample may be, without limitation, a biological specimen, such as blood, synovial fluid, urine or cerebrospinal fluid, or derived from a biological specimen, such as a cervical smear sample, a blood serum or plasma sample, a swab sample such as a nasal, nasopharyngeal or throat swab sample, a stool sample, a sore sample or a sputum sample.

The analysis performed by the device may include nucleic acid amplification of a target nucleic acid, e.g. RNA or DNA, in the sample or derived from the sample, the nucleic acid amplification may be isothermal. Examples of isothermal amplification methods include loop-mediated isothermal amplification (LAMP), strand displacement amplification (SDA), helicase-dependent amplification (HDA), nicking enzyme amplification reaction (NEAR), nucleic acid sequence-based amplification (NASBA), signal mediated amplification of RNA technology (SMART), rolling circle amplification (RCA), isothermal multiple displacement amplification (IMDA), single primer isothermal amplification (SPIA), recombinase polymerase amplification (RPA), and polymerase spiral reaction (PSR). Examples of the nucleic acid analysis method that may be performed in the device are described in International Patent Applications WO2017/017424, WO2018/138499, WO2020/021272 and WO2021/148816. The analysis may involve depositing a volume of liquid sample into a sample receiving chamber of the device, from which at least part of the sample is then transferred to a reaction chamber where it is mixed with one or more reagents, and in which a nucleic acid amplification and/or immunoassay binding takes place. Subsequently, the sample may be conveyed to a test region, for example, to a lateral flow strip in the device.

In some embodiments the analysis process performed by the device may thus be considered to have three stages: mixing of reagent(s) with, or dissolving reagent in, at least part of the sample, the reacting the sample and reagent(s) and then the examination of the reacted sample.

Figure 2:
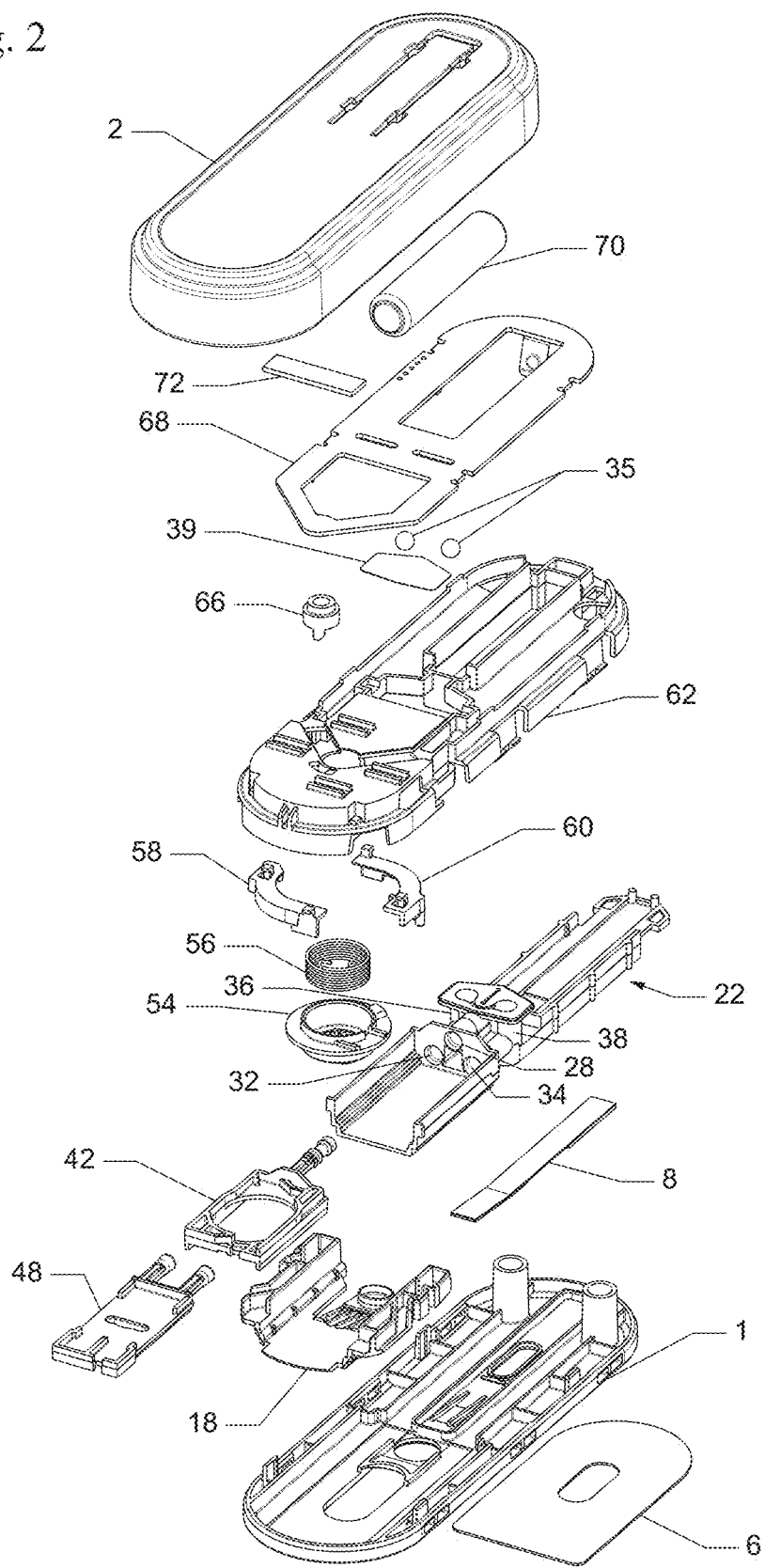
FIG. 2 is a similar view, but from beneath and one side, of the device.
Figure 3:
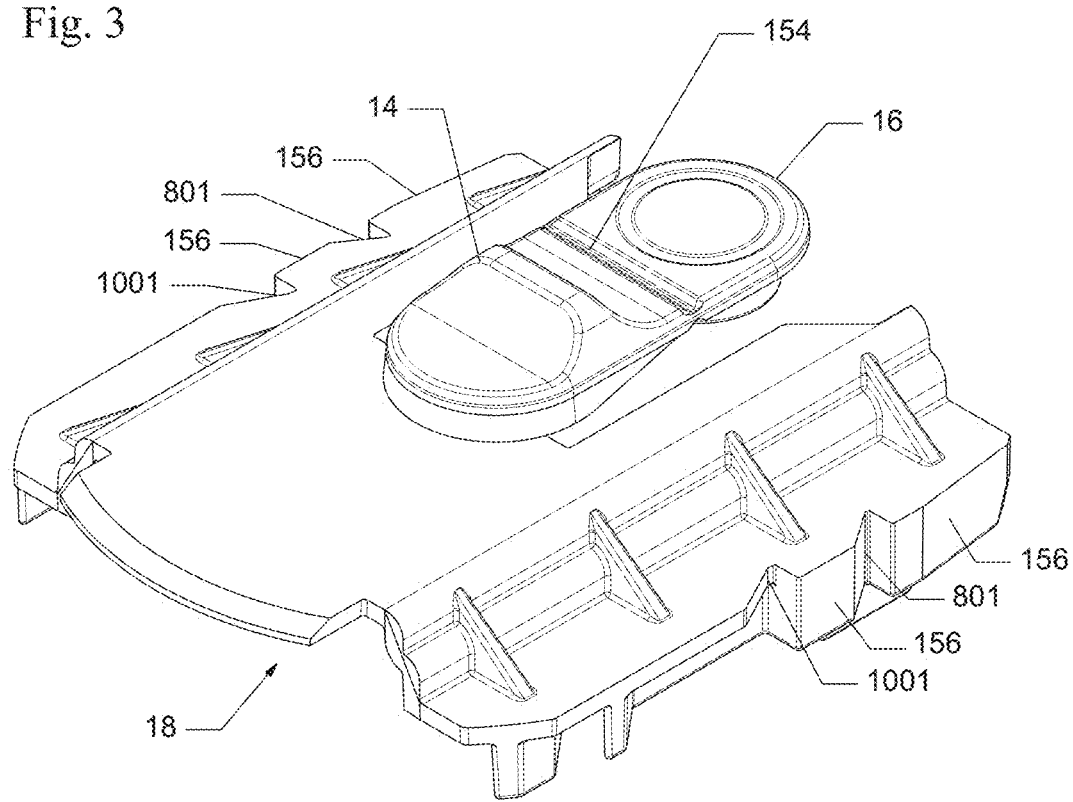
FIG. 3 is an isometric view of the upper side of a slidable lid of the device.

With reference to FIGS. 1 and 2, a device in accordance with the invention comprises a casing having an upper casing half 1 which is snap fitted onto a lower casing half 2. The upper casing half 1 includes an elongate window 4 which is, in use, covered by a transparent label 6, and through which a lateral flow strip (LFS) 8 can be viewed, to determine the results of the analysis performed by the device. The inner surface of the transparent label 6 covering the window 4 may optionally be coated with an anti-fog agent.

The upper casing half 1 also includes an aperture 10 for receiving a sample to be analysed. The aperture 10 is situated just beyond the end of a slot 12 through which a user contactable ridge 14 and hinged cap 16 of a lid 18 extends. The lid 18 is mounted on a guide rail 20 forming part of a chamber block 22, for linear movement along the elongate axis of the casing, and constitutes an actuating member.

The chamber block 22 also includes a sample receiving chamber 24 which is in register with the aperture 10, and an elongate channel forming a LFS chamber 26 for receiving the lateral flow strip 8. The LFS chamber can optionally be bonded to the upper casing half 1 to ensure a leak-tight seal, this may be achieved using an elastomer seal an ultrasonic weld, a labyrinth seal or a bead of elastomer sealant or adhesive. As can be seen from FIG. 2, the chamber block also includes a central horizontal cylindrical valve chamber 28, two horizontal cylindrical piston chambers 32 and 34 positioned above the valve chamber 28, and two vertical, cylindrical reaction chambers 36 and 38 which straddle the valve chamber 28 and are each situated at the end of a respective one of the piston chambers 32 and 34.

One or both of the reaction chambers 36 and 38 contains one or more beads of reagent 35, and the underside of the chambers is closed and sealed by means of a piece of chamber foil 39.

The valve chamber 28 accommodates a valve rod 40 which is mounted on a valve actuator 42 for sliding movement along the underside of the guide 20. Situated beneath, and slidable relative to, the rod 40 and actuator 42 are a pair of parallel pistons 44 and 46 mounted on a piston actuator 48.

The piston actuator 48 has a lateral slot 50 into which an eccentric axial pin 52 of a rotary drive member 54 extends. In use, rotation of the rotary member 54 causes reciprocal movement first in one and then in the opposite direction, of the pistons 46 and 44 so that the latter perform two strokes within their chambers (i.e. cylinders). The central portion 55 of the slot 50 is arced on one side (see for example FIG. 20E). The radius and centre of curvature of the arc correspond to the radius of the rotary member 54 at the pin 52 and the centre of rotation of the rotary member 54 respectively. Thus, while the pin 52 is in the arced portion 55, rotation of the rotary member does not move the pistons. This arrangement can be generally described as a scotch-yoke mechanism with dwell.

The rotary member 54 is mounted atop a coiled torsion spring 56 which biases the rotary member in an anticlockwise direction, as viewed in FIG. 1.

The rotary member 54 (and hence the piston actuator 48) and the valve actuator 42 are each coupled to the lid 18 by a pair of arced linkage arms 58 and 60 in a way described below. The arms 58 and 60 are mounted for lateral sliding movement on a chassis 62 which is snap fitted onto the casing half 1 and which also supports the chamber block 22. The chassis 62 includes a vertical boss 64 on which the spring 56 and rotary member 54 are mounted. The boss 64 also contains a retaining member 66 (in this case in the form of a thermoplastic catch) for pausing the rotation of the rotary member 54, and hence the movement of the pistons 44 and 46. Beneath the chassis 62, there is accommodated a printed circuit board (PCB) 68 and battery 70. Two separate heaters are printed onto the PCB 68, and their operation will be described below. A foam heater pad 72 is positioned under one of the heaters 1201 on the PCB, so as to urge that heater against the underside of the reaction chambers 36 and 38.

The interconnection between various components of the device will now be described.

Figure 13:
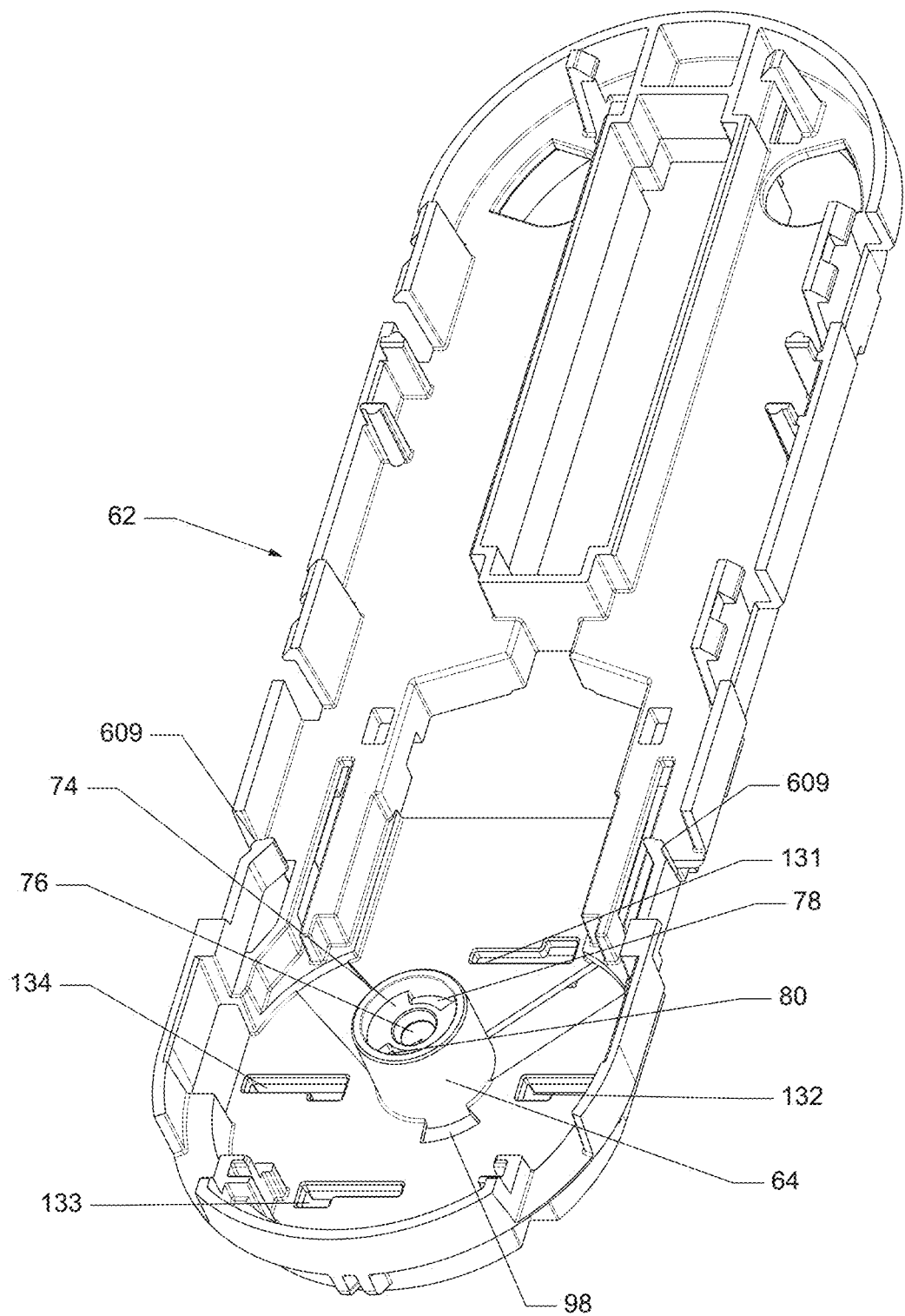
FIGS. 13 and 14 are isometric views, respectively from above and beneath, of a chassis of the device.
Figure 14:
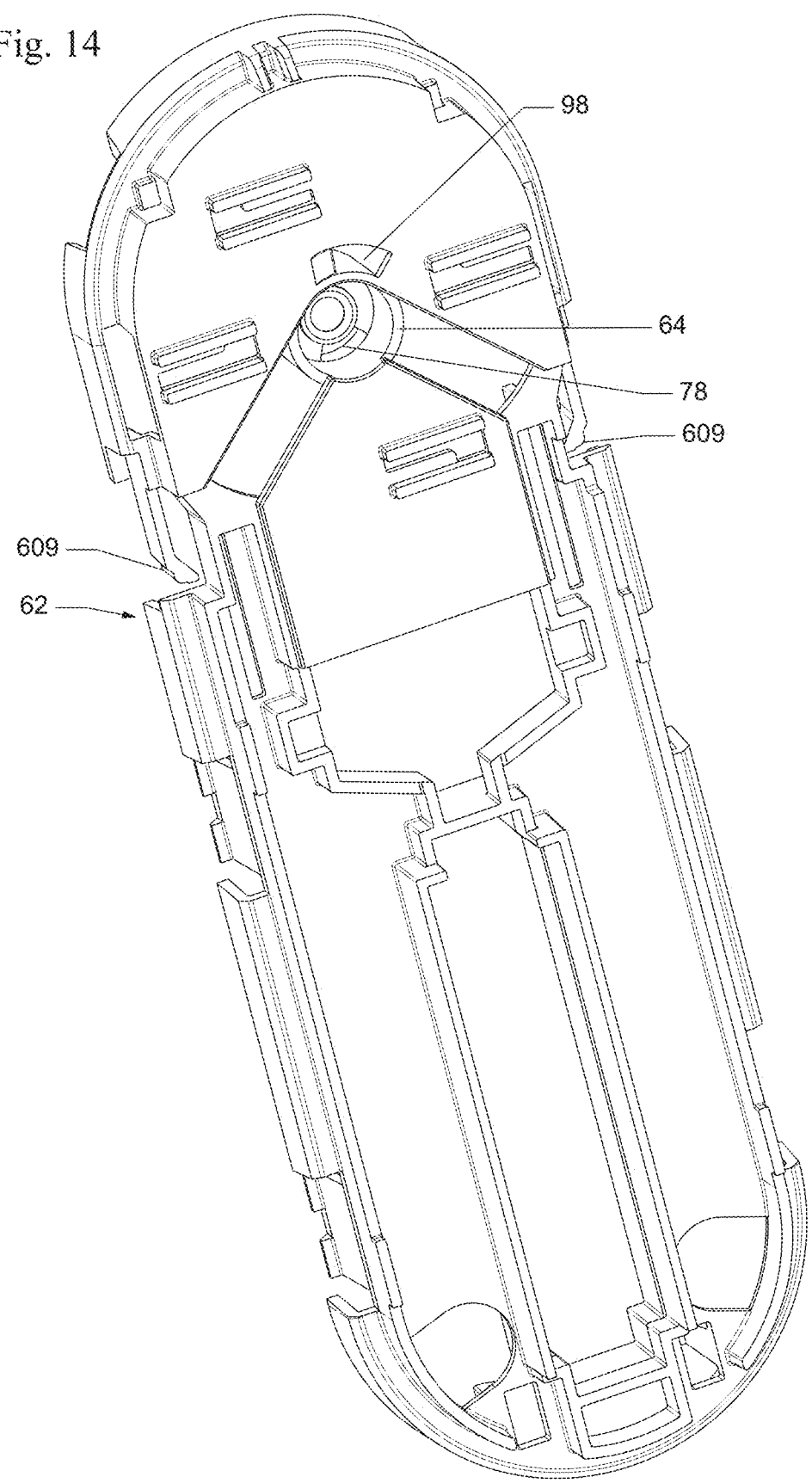

With reference to FIGS. 13 and 14, the boss 64 is open on its underside to define a cylindrical opening for accommodating the retaining member 66. An upper radial wall 74 extends from the inner edges of the boss, and includes a central circular aperture 76 and a pair of diametrically opposed edge apertures 78 and 80. The retaining member 66 has a cylindrical base portion 82 situated under a larger diameter cylindrical body portion 84 from the top of which a pair of axial fingers 86 and 88 extend. Each of the fingers 86 and 88 includes a respective ramp surface 90, 92 which is inclined relative to the radial plane of the retaining member. In the assembled device, the retaining member 66 is a close fit within the boss 64, with the fingers 86 and 88 protruding upwardly through the edge apertures 78 and 80. The PCB 68 has a tip 94 which extends under the cylindrical opening defined by the boss so as to retain the member 66 therein. A heater is printed onto the tip 94 and, in use, melts the base 82, as described below.

The spring 56 fits over the outside of the boss 64 and has a hooked lower end 96 which fits into a slot 98 in the chassis 62. The opposite end of the spring 56 is also provided with a hook 100 that locates in a slot 102 in the upper face of the rotary member 54. The spring 56 is preloaded so as to exert a torsional biasing force on the rotary member 54, so as to urge the latter to rotate in an anticlockwise direction.

Figure 10:
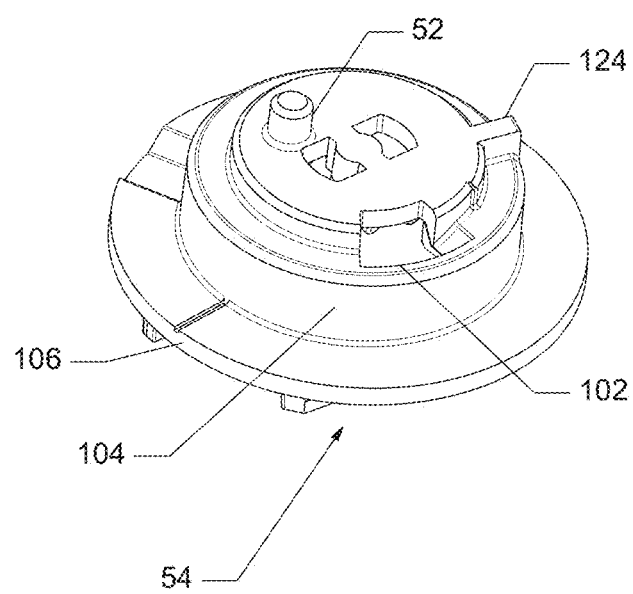
FIGS. 10 and 11 are isometric views, respectively from above and below, of a rotary member of a drive mechanism for the device.
Figure 11:
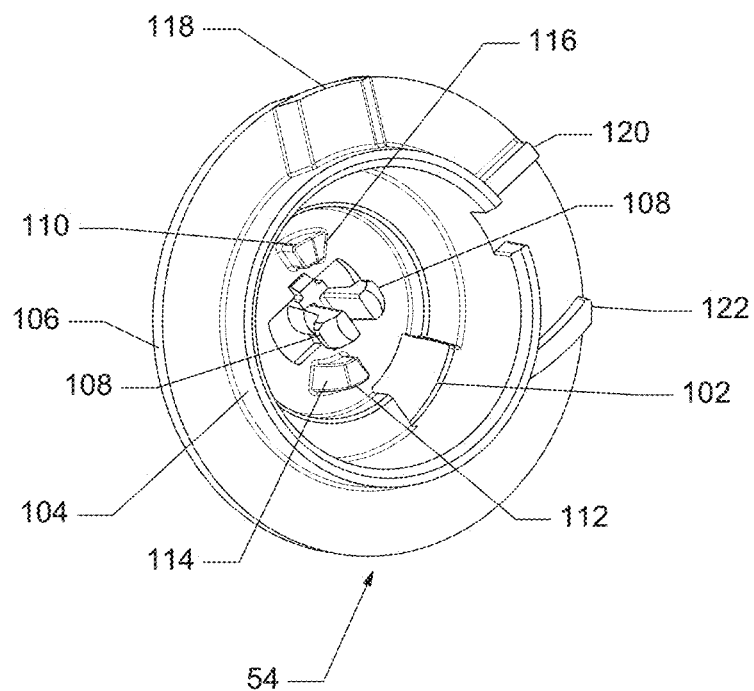
Figure 12:
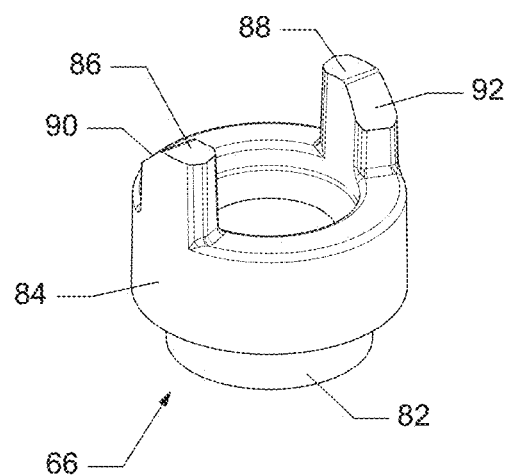
FIG. 12 is an isometric view of a thermoplastic retaining member or catch forming part of the drive means.

As can be seen in FIGS. 10 and 11, the rotary member 54 has a generally cylindrical body portion 104 and a radial flange 106 projecting outwards from an axially intermediate part (i.e. between the top and bottom) of the body portion 104. Two opposed snap arms 108 extend downwards from the top of the body portion and, in the assembled device, are snap fitted into the central, circular aperture 76 of the boss 64, so that the rotary member 54 is retained on the boss, and hence the chassis 62, but can rotate about the axis of the boss 64. Two diametrically opposed abutments 110 and 112 extend axially down from the top of the body portion 104, and each has a respective inclined surface, 114 and 116, for engaging a respective one of the ramps 90 and 92 on the fingers 86 and 88 of the retaining member 66.

The underside of the flange 106 is provided with a number of formations used in the control of the operation of the device. More specifically, the flange has a dipped portion 118 that functions as a proximity switch actuator for an electro optical switch on the PCB 68. The actuator closes the switch when the rotary member 54 has finished its final rotation stage.

A first rib 120 extends generally radially from the body 104 and, in use, engages an abutment on the linkage arm 60 in the way described below. A second, slightly curved rib 122 is also provided on the underside of the flange 106 and engages an abutment on the arm 58, again as discussed below. A further radial rib 124 is provided in the top of the body portion 104 and, in use, engages the piston actuator 48 at the end of the operation of the device.

It will be appreciated that the spring 56 is situated on the outside of the boss 64, but within the body portion 104.

With reference to FIGS. 6-9, each of the linkage arms 58 and 60 is of a generally arced shape, and includes a respective pair of hooked lugs 125, 126, 128 and 130 by which the linkage arms are mounted in guide slots 131-134 in the chassis 62 so that the arms are constrained to move linearly in a direction perpendicular to the elongate axis of the device.

The linkage arms 58 and 60 are of a similar construction to each other, save for the orientations of the lugs, and both have a pin 132 and 134 for engaging in a respective guide track on the underside of the lid 18 and a valve rib 136 and 138 which makes a camming engagement with the valve actuator 42 to move the valve forward as the arm is moved outwards, at 90° to the movement of the valve.

Each of the arms also includes a stop 140, 142 which in use abuts a respective one of the ribs on the underside of the flange 106 of the rotary member 54 to prevent rotation of the latter.

The stop 142, in use, engages the first rib 120 prior to the operation of the device. The stop 140 engages the second rib 122 to control the speed of the rotary member 54 as the abutments 110 and 112 approach the fingers 86 and 88.

Figure 5:
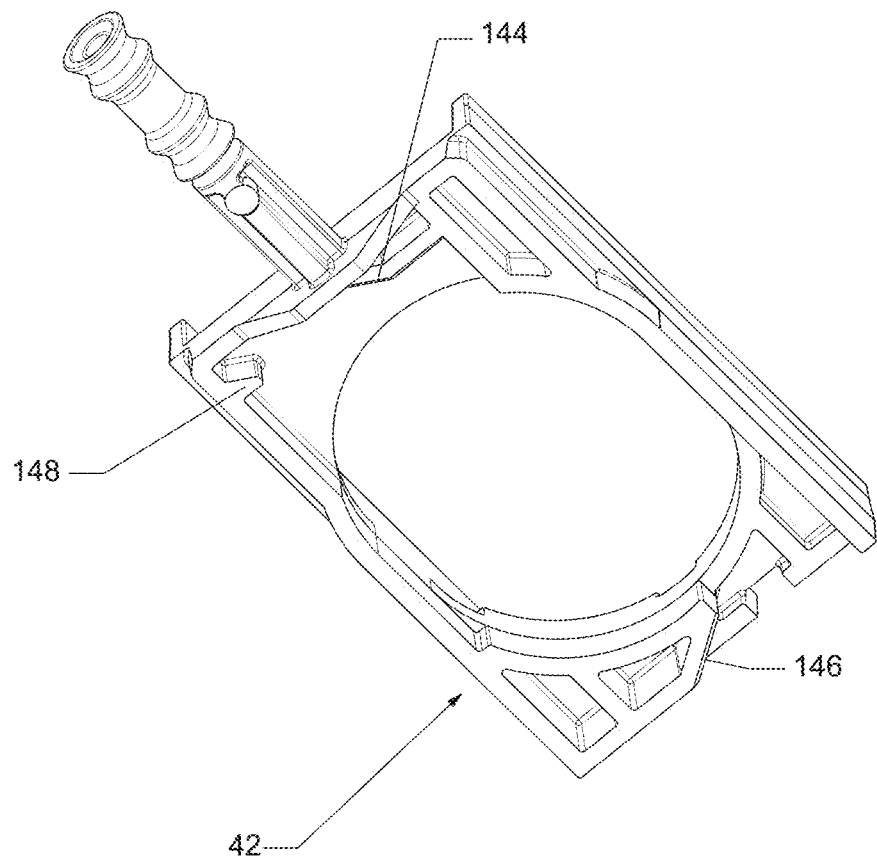
FIG. 5 is an isometric view of the underside of a valve member and valve actuator of the device.
Figure 6:
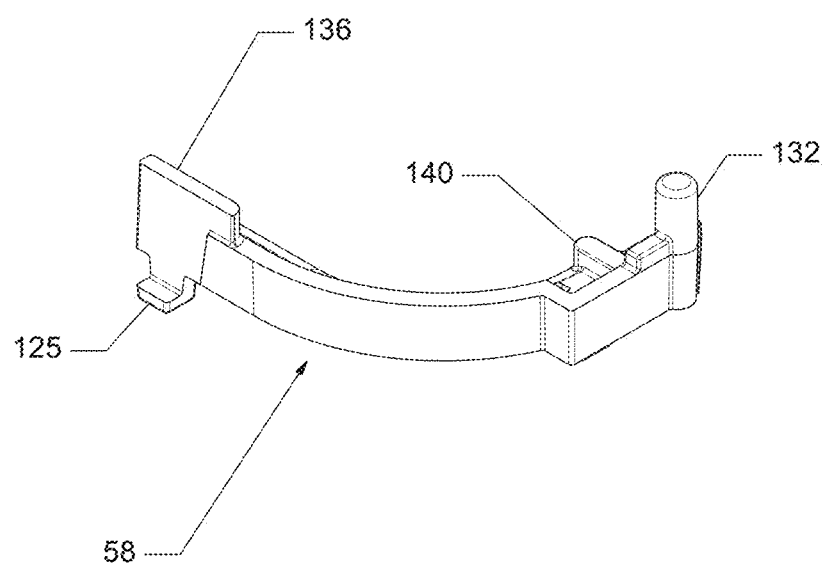
FIGS. 6 and 7 are isometric views, respectively from above and below, of a linkage arm for providing an operating linkage between the lid and the valve actuator.
Figure 7:
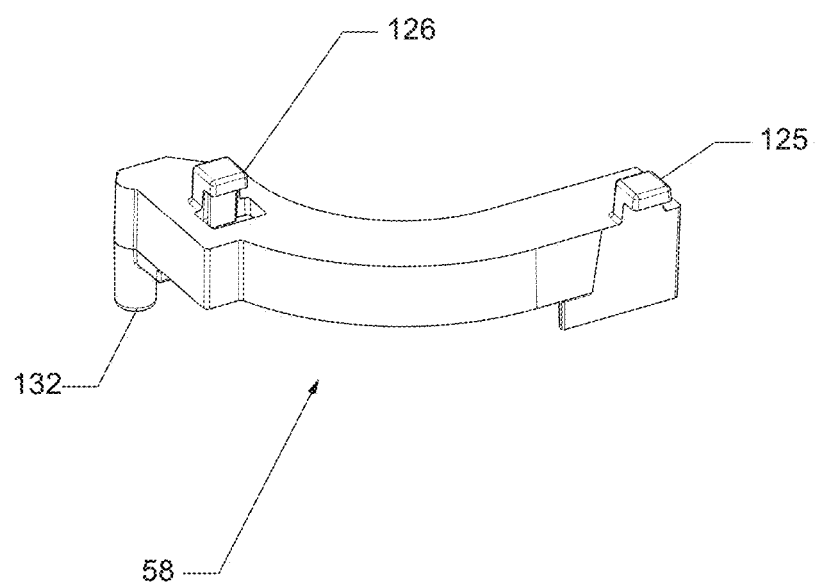
Figure 8:
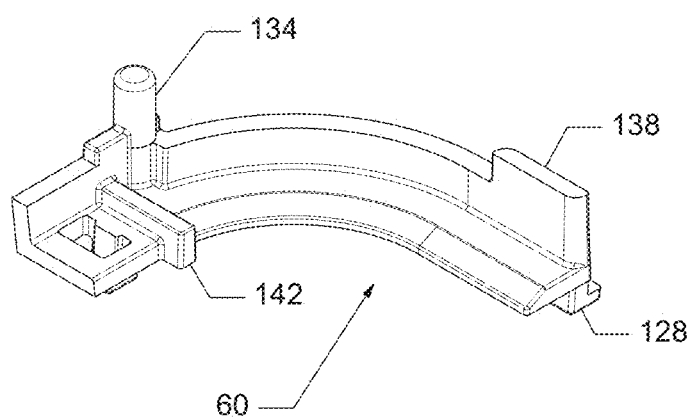
FIGS. 8 and 9 are similar views of another such linkage arm.
Figure 9:
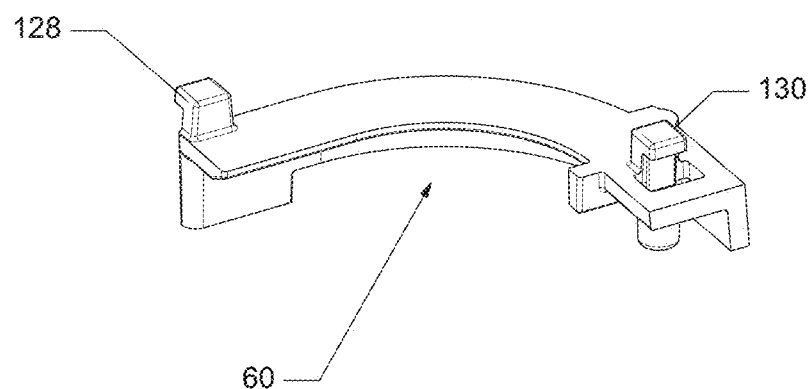

FIG. 5 shows the underside of the valve actuator 42 and the valve rod 40. It can be seen that the underside of the actuator has a number of formations including a forward camming surface 144 and a rearward camming surface 146 opposite the camming surface 144 is a forward catch 148. As can be seen in, for example, FIG. 20A, the valve rib 138 of the actuator arm 60, with the valve in its initial position, is situated in the space between the forward camming surface 144 and the catch 148. The valve rib 138 releasably holds the valve actuator, and hence the various connected movable components of the device, in a starting position. Sliding the lid 18 forwards along the device will cause horizontal outward movement of the arm 60, and hence movement of the valve 138 towards the camming surface 144, thus moving the valve actuator and valve rod linearly forwards in the device. This movement will bring the valve rib 136 into lateral alignment with the rearward camming surface 146, so that the subsequent outward movement of the arm 58 will cause further forward movement of the valve actuator 42, and hence the valve rod 40.

Figure 4:
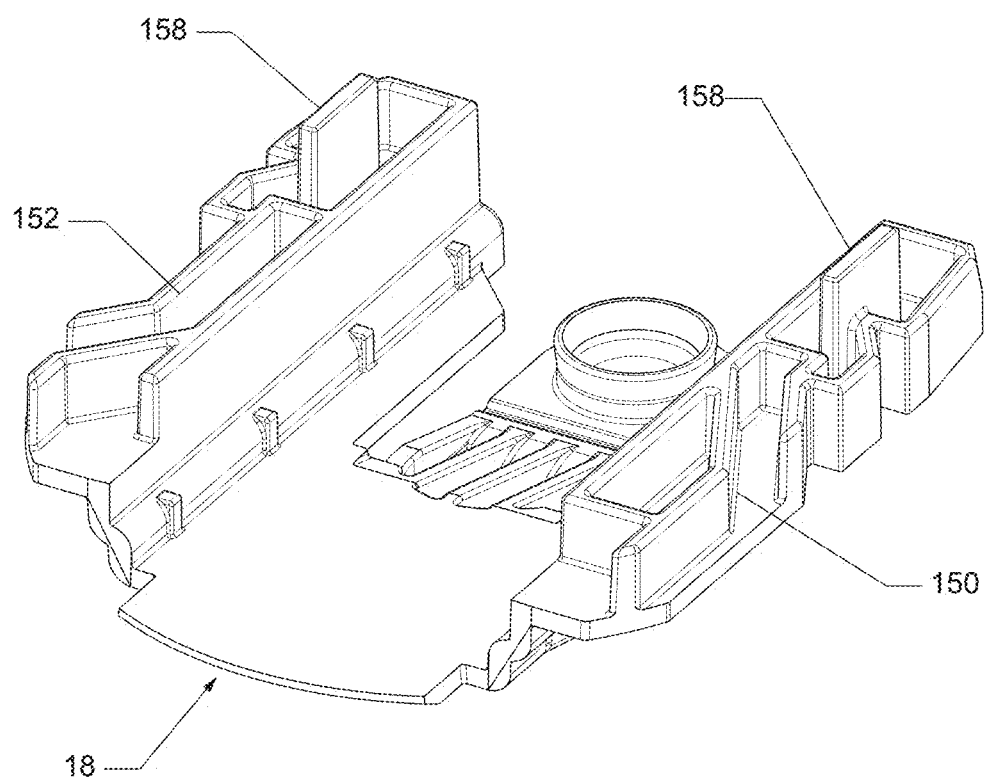
FIG. 4 is a similar view of the underside of the lid.

The pins 132 and 134 each extend into a respective guide way 150, 152 formed on the underside of the lid 18. As can be seen from FIG. 4, the guide ways both diverge away from the central elongate axis of the lid 18, with the guide way 150 doing this at a position further towards the front of the lid 18 than the guide way 152. Consequently, movement of the lid 18 in a forward direction causes lateral outward movement of the arm 60 before lateral movement of the arm 58 in the opposite direction occurs.

The cap 16 is connected to the rest of the lid 18 through a living hinge 154, and the lid is provided with ramps on either side, such as the ramp 156 which, in use, engage with flexible arms 609 on the chassis to provide the user with tactile feedback of the position reached during the forward sliding movement of the lid 18 and to lock the lid in its final position and prevent it being returned to its initial position. Switch tabs 158 extend down from the underside of the lid 18, and toggle activation of certain electrical components as the lid moves forward, as explained below.

The chamber block 22 of the device will now be described in detail with reference to FIGS. 17A and 17B, which show top-down and bottom-up views of the chamber block 22 respectively.

The chamber block 22 has several distinct zones for containing liquid at different stages of the procedure. The first of these is the sample receiving chamber 24 into which the liquid sample is placed; this chamber is most clearly visible in FIG. 17A. The liquid sample could be a blood sample or saliva sample for example, and it may optionally be mixed with other liquids such as one or more buffers.

Figure 17B:
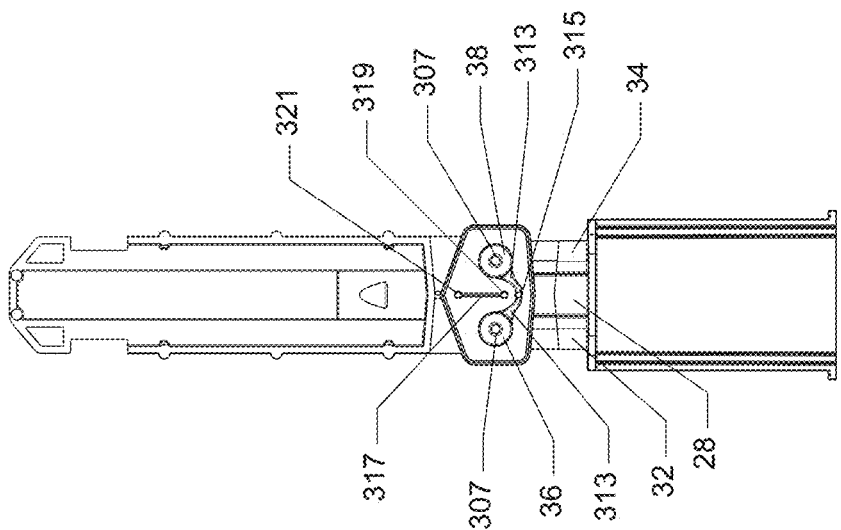
FIGS. 17A and 17B are plan views, from above and below respectively, of a chamber block of the device.
Figure 17A:
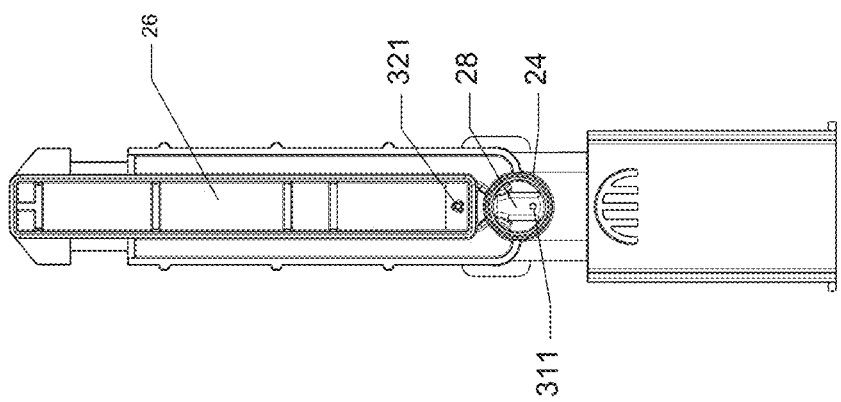

Referring still to FIG. 17A, the chamber block 22 additionally features an elongate channel forming a LFS chamber 26 for housing the lateral flow strip (LFS) 8.

As shown in FIG. 17B, each of the two reaction chambers 36, 38, has a chamber post 307. The reaction chambers 36, 38 are the regions in which the liquid sample mixes with the reagent. The bottom part of each of the reaction chambers 36, 38 is preferably sealed by a chamber sealing surface, such as the chamber foil 39 illustrated in FIG. 1. As will be described in more detail below, each of the reaction chambers 36, 38 is shown housing one bead 35, and the purpose of the chamber posts 307 is to retain the beads 35 in the correct position within the reaction chambers 36, 38, for example when the device is in transit.

The valve chamber 28 receives the valve rod 40 and enables the sample receiving chamber 24, LFS chamber 26 and reaction chambers 36, 38 to be selectively fluidly connected to one another through linear movement of the valve rod 40 within the valve chamber 28 during operation of the device.

The sample receiving chamber 24 is directly fluidly connected to the valve chamber 28 through a valve port 311. The reaction chambers 36, 38 are each connected to a respective reaction chamber channel 313, each of which is in turn fluidly connected to the valve chamber 28 through a single (i.e. shared) reaction chamber channel port 315. The LFS chamber 26 is similarly connected to the valve chamber via an LFS channel 317, which is fluidly connected to the valve chamber 28 at an LFS channel entry port 319 and is fluidly connected to the LFS chamber 26 at an LFS channel exit port 321.

Cylindrical piston chambers 32 and 34 are positioned parallel to, and either side of, the valve chamber 28. As will be described below, each piston chamber is fluidly connected to a respective reaction chamber 36, 38 and is shaped to receive a respective piston.

Figure 16C:
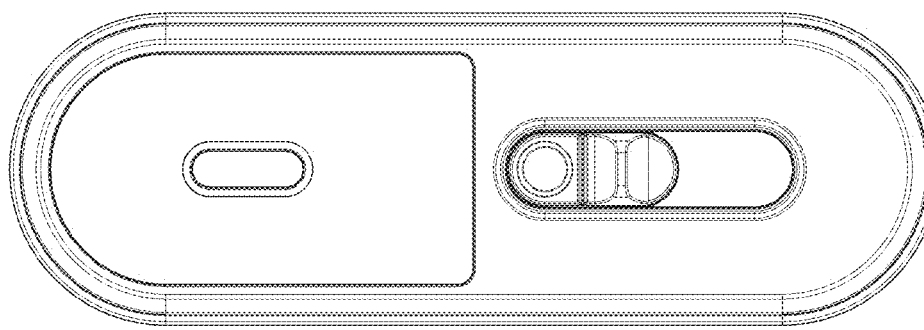
FIGS. 16A-16C are plan views of the device showing the lid in a respective one of three positions, associated with different stages of the procedure performed by the device.
Figure 16B:
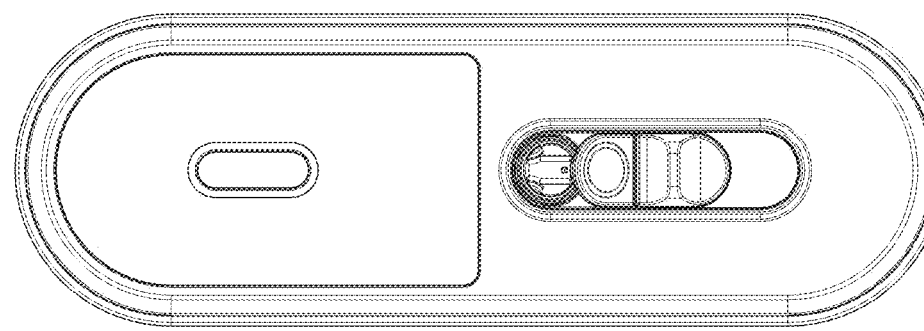
Figure 16A:
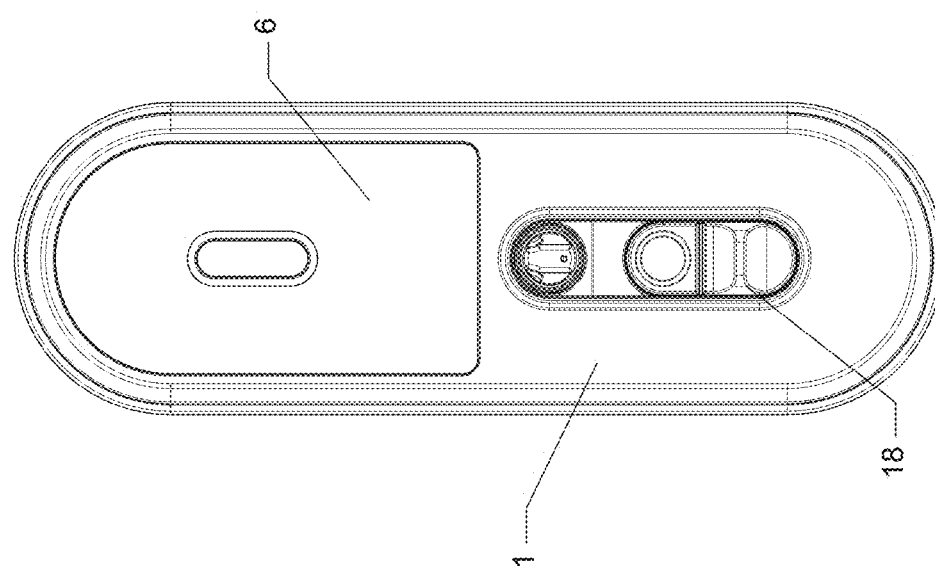

As the lid 18 is moved between the series of positions illustrated in FIGS. 16A-16C, the pistons 44 and 46 are initially controlled to draw the liquid sample from the sample receiving chamber 24 into the reaction chambers 36, 38 where it mixes with the reagent (provided in the form of the beads 35) to form a solution (or mixture) and is heated. The pistons 44 and 46 are subsequently controlled to drive the resulting solution out of the reaction chambers at the appropriate time and onto the LFS strip 8. As will be described in more detail below, moving the lid 18 between the positions in FIGS. 16A-16C also adjusts the position of the valve rod 40 within the valve chamber 28, thereby selectively connecting, so as to establish flow paths between, the various chambers of the chamber block 22 as required.

Figure 18:
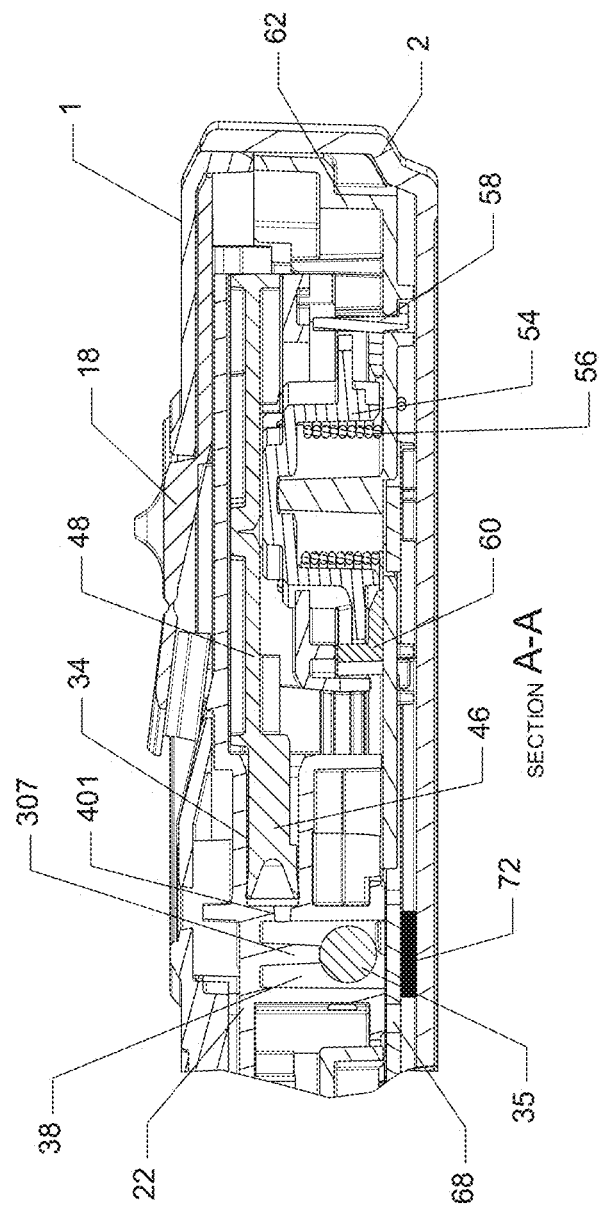
FIG. 18 is a sectional view along the line A-A of FIG. 15, when the device is in a configuration in which the lid is in a first, starting position.
Figure 19A:
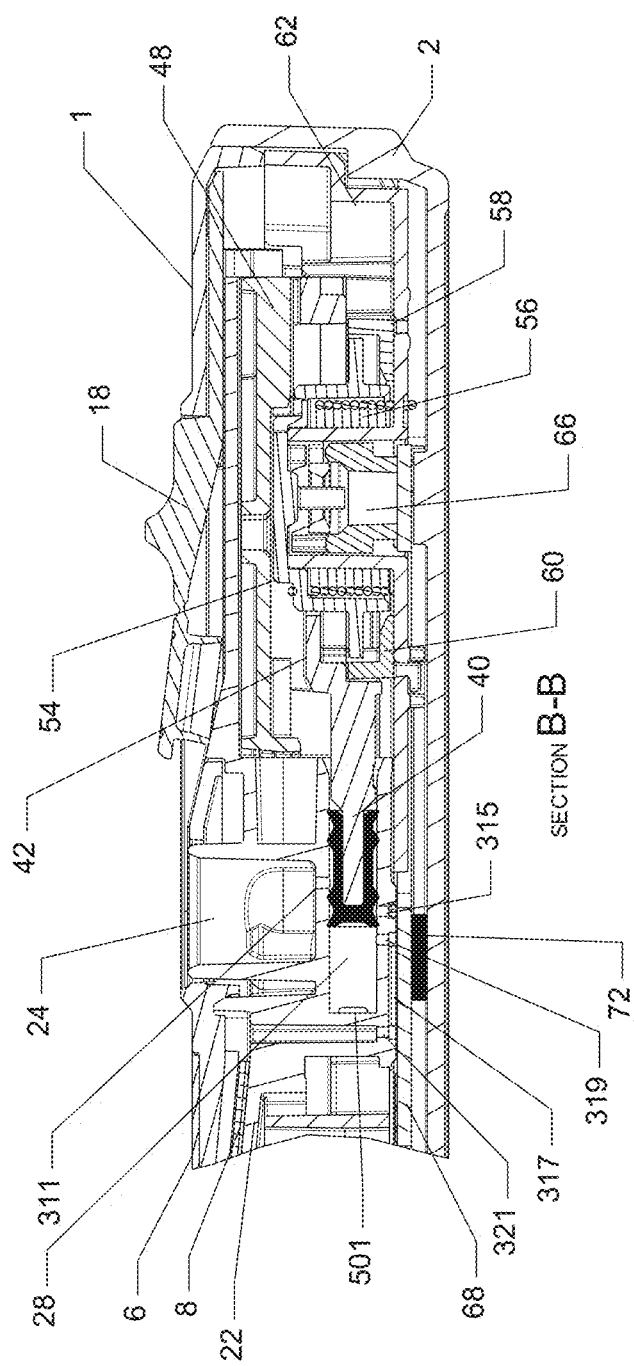
FIG. 19A is a sectional view along the line B-B, when the device is in the same configuration.
Figure 19B:
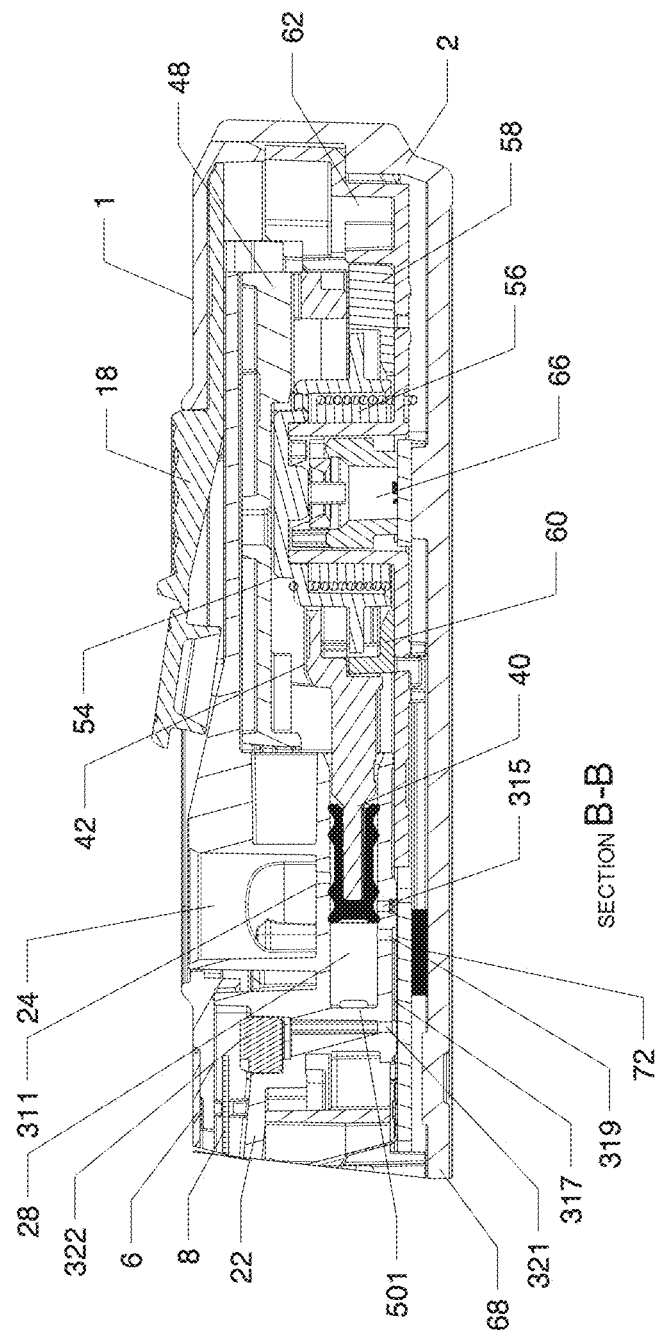
FIG. 19B corresponds to FIG. 19A but shows an alternative embodiment of the device incorporating an additional valve.

The interconnection between the chambers of the chamber block 22 can be seen in the cross-sectional views of the diagnostic device shown in FIGS. 18, 19A and 19B.

Figure 15:
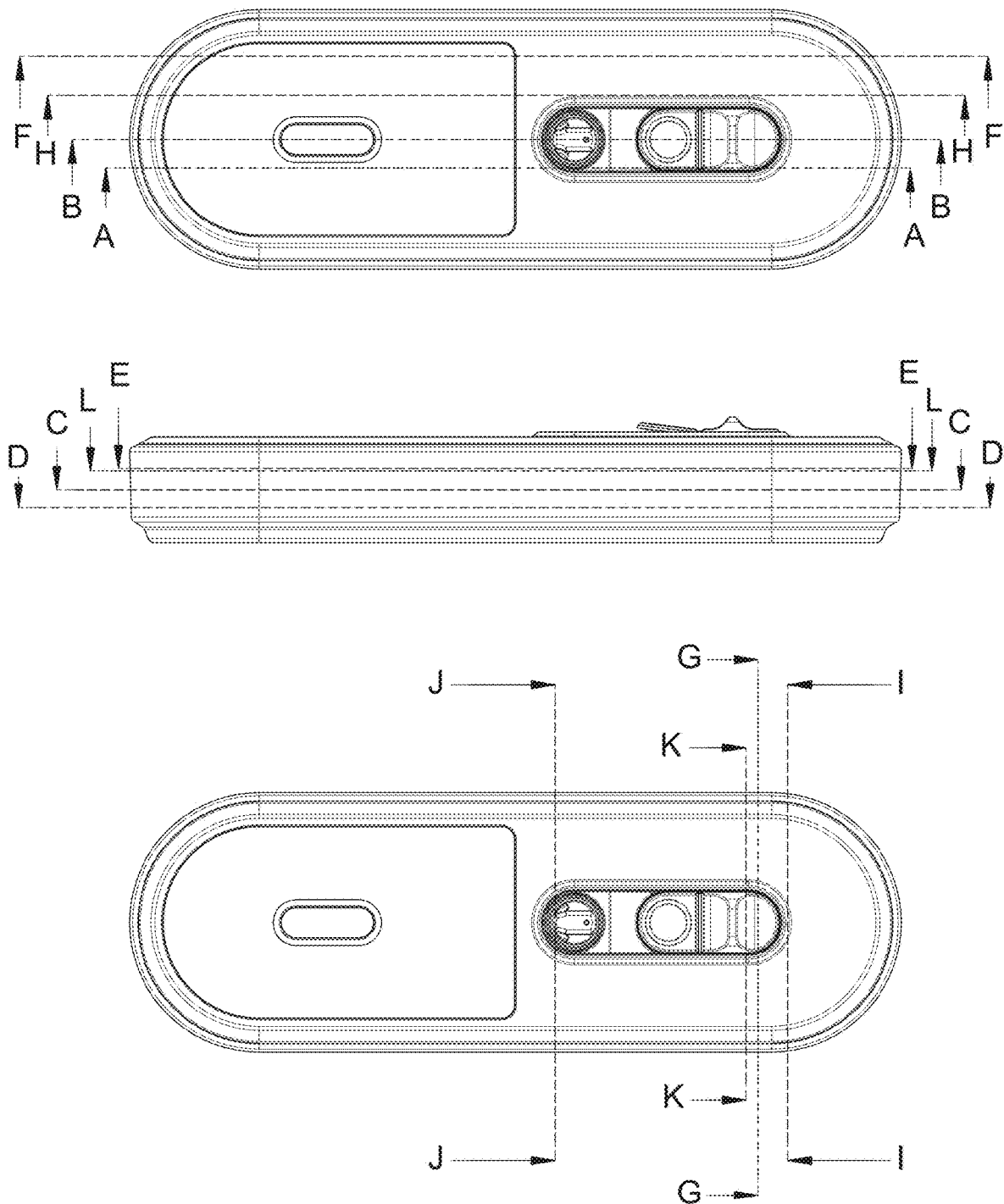
FIG. 15 comprises two plan views and one side elevation of the device, showing the positions of lines along which the sectional views shown in subsequent figures are taken.

Starting with FIG. 18, which shows a cross-sectional view of the device along section line A-A of FIG. 15, a bead 35 can be seen retained by a respective chamber post 307 within a respective reaction chamber. The reaction chamber is fluidly connected to a respective piston chamber 32 and 34 by a respective piston port 401. In FIG. 18, the pistons 44 and 46 are shown fully inserted into the piston chambers 32 and 34.

Moving on to FIG. 19A, which shows a cross-sectional view of the device along section line B-B of FIG. 15, the sample receiving chamber 24 can be seen connected to the valve chamber 28 via the valve port 311.

The valve rod 40, positioned in the valve chamber 28, is shaped such that it selectively connects the reaction chambers 36, 38 to the sample receiving chamber 24 or the LFS chamber 26 as it is linearly translated within the valve chamber 28 during operation of the device. In the illustrated example, the tip of the valve rod 40 has a ribbed/ridged seal that restricts the flow of liquid such that it can only flow in the region between two adjacent ribs/ridges, i.e. the ribs/ridges around the circumference of the valve rod 40 form a tight seal against the inner surface of the valve chamber 28. The seal could be made of a material such as rubber, and it may optionally be replaced with another sealing/coupling mechanism, such as a series of axially fixed O-rings or similar.

In FIG. 19A, the valve rod 40 is in the maximally withdrawn/retracted position such that the sample receiving chamber 24 is not fluidly connected to the other chambers (i.e. it is only fluidly connected to the valve chamber 28).

The reaction chamber channel port 315 is also visible in FIG. 19A. This port connects the valve chamber 28 to the reaction chambers 36, 38 via the reaction chamber channels 313. In the configuration in FIG. 19A, the valve rod 40 is positioned such that the reaction chambers 36, 38 are fluidly connected to the valve chamber 28 but not to the sample receiving chamber 24 or the LFS chamber 26 housing the LFS strip 8. The reaction chambers 36, 38 are always fluidly connected to the piston chambers 32 and 34 via the piston ports 401, i.e. the valve rod 40 does not affect or control the coupling between the reaction chambers 36, 38 and the piston chambers 32 and 34.

As mentioned above, the LFS chamber 26 is connected to the valve chamber 28 via the LFS channel 317. The LFS channel 317 is connected to the valve chamber 28 via the LFS channel entry port 319, and it is connected to the LFS chamber 26 via the LFS channel exit port 321. In the configuration in FIG. 19A, the LFS chamber 26 is fluidly connected only to the valve chamber 28, i.e. it is not in fluidic communication with the sample receiving chamber 24 or reaction chambers 36, 38.

An opening 501 is arranged at an end of the valve chamber 28. This allows air to discharge from the valve chamber 28 as the valve rod 40 is inserted into the valve chamber 28 during operation of the device.

FIG. 19B shows an alternative embodiment of a device in accordance with the invention in which a LFS valve 322 is positioned downstream of the LFS channel exit port 321. The LFS valve 322 allows liquid to be selectively admitted to the LFS chamber 26 preferably in one direction only. The LFS valve 322 may be a pressure activated passive valve, such as a duckbill, umbrella or cross-slit type valve.

The operation of the device will now be described.

The initial state of the diagnostic device is shown in FIGS. 20A-20F, which show cross-sectional views of the device through section lines C-C, D-D, B-B, A-A, E-E and F-F respectively of FIG. 15. This is the state in which the device is supplied to a user for performing a test.

In use, the sample is introduced into the sample receiving chamber 24, and the lid 18 is translated linearly forward from its first position (initial position) by a user of the device, thereby causing each of the linkage arm pins 132, 134 (and consequently the arms themselves) to be guided linearly outward (that is, away from a central longitudinal axis of the device) by the guide ways 150 and 152 at a predetermined stage during operation of the device. The first arm 60 and second arm 58 are retained in the device in such a way that they can only move linearly inward or outward, i.e. movement in a direction parallel to the longitudinal axis of the device is prevented.

Linear movement of the lid 18 is resisted by flexible arms 609 positioned on opposing sides of the chassis 62, which are initially in a neutral unbent position.

The valve rod 40 is initially in a maximally withdrawn position, as most visible in FIG. 20C. Movement of the valve rod 40 is initially prevented by the valve rib 138 on the first arm 60, which engages with the valve actuator 42, as described above. In this position the valve rod 40 prevents fluidic communication between the sample receiving chamber 24, LFS chamber 26 and the reaction chambers 36, 38 (i.e. these channels are closed from one another). In addition, the configuration of the valve rod 40 means that the beads 35 in the reaction chambers 36, 38 are shielded from moisture.

FIG. 20B shows a top-down cross-sectional view of the device through the rotary member 54. The rotary member 54 is resiliently biased by the drive spring 56 (not shown in FIG. 20B), which biases the rotary member 54 to turn in an anticlockwise direction when the device is viewed from above. In the initial state of the device, anticlockwise rotation of the rotary member 54 is prevented by the abutment between the valve rib 142 on the first arm 60 and the rib 120 on the rotary member 54.

As seen in FIGS. 20D and 20E, which show side and top-down cross-sectional views through the piston 46, the pistons 44 and 46 are initially fully inserted, i.e. with both pistons fully within the piston chambers 32 and 34. As will be described in additional detail below, the pistons 44 and 46 are actuated by the pin 52 on the rotary member 54 when the user moves the lid 18. The pin 52 is retained in the slot 50 on the piston actuator 48 in a scotch-yoke arrangement such that rotational movement of the rotary member 54 is converted into linear movement of the pistons.

FIG. 20F shows a side cross-sectional view through an activation switch 623 on the PCB 68. The activation switch 623 is initially in an open position.

After, a sample, such as a blood or saliva sample taken from a patient (and optionally mixed with another liquid such as a buffer solution) has been loaded into the sample receiving chamber 24 by the user, the user then proceeds to push the lid 18 forward into the position shown in FIG. 16B.

FIGS. 21A-21F show the configuration of the device in an intermediate stage with the lid 18 transitioning between the positions illustrated in FIGS. 16A and 16B. The views shown in FIGS. 21A-21F correspond to those of FIGS. 20A-20F, but with the lid 18 moved into the new position.

As seen in FIG. 21A, the flexible arms 609, which resisted movement of the lid 18 in the initial position, are now bent by flexible arm ramps 156 on the lid 18. The flexible arms 609 continue to abut against the flexible arm ramps 156, thereby continuing to resist movement of the lid 18 due to the friction between the flexible arms 609 and the flexible arm ramps 156.

Referring still to FIG. 21A, moving the lid 18 forward causes the first arm pin 134 to follow the guide way 150 on the lid 18, thereby causing the first arm 60 to move linearly outward (that is, away from the central axis of the device). As the first arm 60 moves linearly outward, the first arm valve rib 138 forces the valve rod 40 further into the valve chamber 28.

As most visible in FIG. 21C, the linear movement of the valve rod 40 into the valve chamber 28 brings the valve port 311 and reaction chamber channel port 315 into fluidic communication with each other, thereby connecting (and establishing a flow path between) the sample receiving chamber 24 and the reaction chambers 36, 38 such that liquid can flow between these chambers upon application of a suitable pressure gradient (the lack of such a pressure gradient means than no liquid flows at this stage). The LFS channel 317 remains isolated from both the sample receiving chamber 24 and the reaction chambers 36, 38 at this stage.

As shown in FIG. 21B, the rotary member 54 is still retained in its initial position due to the abutment between the stop 142 on the first arm 60 and the rib 120 on the rotary member 54. The pistons 44, 46, which are coupled to the rotary member 54 via the pin 52, also remain in their initial positions (as shown in FIGS. 21D and 21E). Likewise, the activation switch 623 remains in an open position (as shown in FIG. 21F).

Figure 22G:
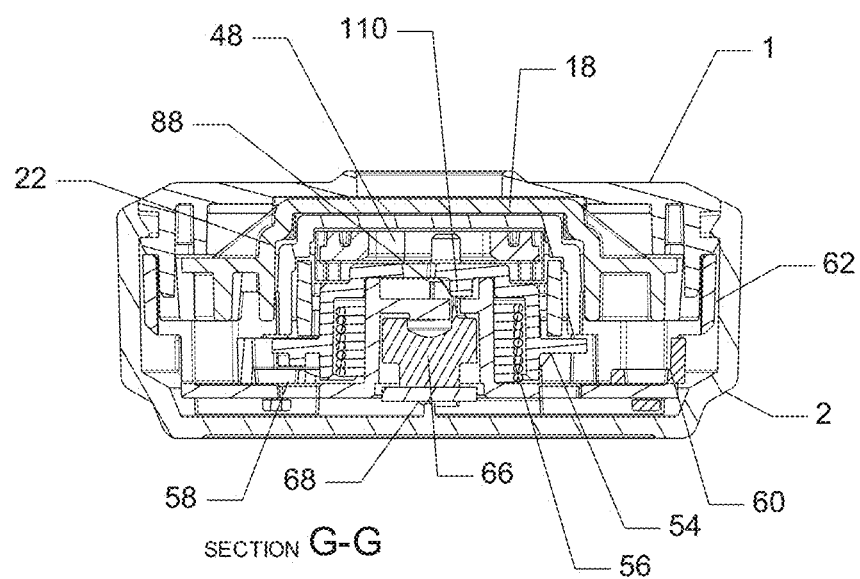
FIG. 22G is a section along the line G-G of FIG. 15, also showing the device when the lid is in the third position.

The user continues to move the lid 18 forward into the position shown in FIGS. 22A-22G, which show the configuration of the device with the lid 18 moved fully into the position shown in FIG. 16B. The views shown in FIGS. 22A-22F again correspond to those of FIGS. 20A-20F (and FIGS. 21A-21F), but with the lid 18 moved to the new position. FIG. 22G is a cross-sectional view of the device through section line G-G of FIG. 15.

As shown in FIG. 22A, the click arms 609 on the chassis 62 are received in first grooves 801 on the lid 18 and return to their original unbent position. At this stage, the user feels a click which, combined with the increased angle between the arm ramps 156 and click arms 609, causes the user to pause. As described below, this pause provides time for liquid to move between the sample receiving chamber 24 and the reaction chambers 36, 38 of the chamber block 22.

No further movement of the valve rod 40 occurs at this stage, such that the reaction chambers 36, 38 remain fluidly connected to the sample receiving chamber 24 (as shown in FIG. 22C).

Referring still to FIG. 22A, the first arm 60 has now moved further outward due to the pin 134 continuing to follow the guide way 150 on the lid 18 as the lid 18 is moved further forward by the user. As can be seen in FIG. 22B, this further movement of the first arm 60 causes the stop 142 and the rib 120 to disengage, thereby freeing the rotary member 54 to rotate due to the resilient bias provided by the spring 56. The rotary member rotates until the rib 122 on the rotary member 54 engages with the stop 140 on the second linkage arm 58.

The movement of the rotary member 54 in turns causes the pistons 44, 46 to fully retract/withdraw within the piston chambers 32 and 34 of the chamber block 22, as visible in FIGS. 22D and 22E (i.e. the rotational movement of the rotary member 54 is converted into linear movement of the pistons through the interaction between the pistons and the pin 52 as the pin 52 follows the piston slot 50). The withdrawal of the pistons creates a partial vacuum within the piston chambers 32 and 34, thereby drawing air (or other gas, if the device has been purged) out of the reaction chambers 36, 38 and into the piston chambers 32 and 34 via the piston ports 401. The volume of air that is drawn into the piston chambers 32 and 34 is predetermined by the size of the piston chambers 32 and 34 and the distance that the pistons move.

Due to the valve rod 40 being positioned to couple the reaction chambers 36, 38 to the sample receiving chamber 24, this in turn causes the liquid sample to be drawn from the sample receiving chamber 24 into the reaction chambers 36, 38 via the reaction chamber channels 313 and the reaction chamber channel port 315. The volume of liquid drawn into the reaction chambers 36, 38 corresponds to the volume of air that is drawn into the piston chambers 32 and 34, i.e. this is a predetermined volume.

In summary, the withdrawal of the pistons causes a pre-determined volume of the liquid sample to be drawn from the sample receiving chamber 24 into the valve chamber 28 through the valve port 311, and then into the reaction chambers 36, 38 through the reaction chamber channel port 315 and the reaction chamber channels 313.

At this stage, the beads 35, which are preferably lyophilised reagent beads or similar, mix with the liquid sample to form a solution (or mixture). Alternatively, the reagent may be in liquid form in the device or dried in situ rather than provided as a bead.

As shown in FIG. 22F, the activation switch 623 is now closed by a switch tab 158 on the lid 18. Actuation of the activation switch 623 in this way activates the device in a so-called 'dark mode' such that the user is not aware that the device is active. Actuation of the activation switch 623 also starts a timer to ensure that the lid 18 is not moved too quickly; this is to ensure that there is sufficient time for liquid flow between the sample receiving and reaction chambers. A reagent heating element on the PCB 68 may also be activated at this stage to begin heating the solution in the reaction chambers 36, 38.

A latch blockage 110, 112 on the rotary member 54 may abut against a rotary member blockage 86, 88 on the retaining member 66 at this stage, as shown in FIG. 22G, which shows an end-on cross-sectional view taken through the retaining member 66. However, the retaining member 66 remains unengaged at this stage, i.e. the retaining member 66 does not inhibit rotation of the rotary member 54 at this point due to apertures 78, 80 which allow the fingers 86, 88 on the retaining member 66 to rotate until they are blocked by the edge of the apertures. Whilst retaining its functionality as described herein, the retaining member 66 may be free to rotate by up to about 15°, this allows the retaining member and the rotary member to be assembled without the fingers 86, 88 interfering with the latch blockage features 110, 112 whilst allowing maximum rotation of the rotary member which allows it to be of a smaller diameter whilst achieving the same mechanical action and so makes it more efficient.

After a brief pause (due to the click arms 609 clicking into the first grooves 801 on the lid 18 and causing the resistance of the lid 18 to increase), the user continues to move the lid 18 forward towards the position in FIG. 16C. FIGS. 23A-23F show the configuration of the device with the lid 18 between the positions shown in FIGS. 16B and 16C. The views in FIGS. 23A-23E correspond to those in FIGS. 22A-22E with the lid 18 in the updated position, and the view in FIG. 23F corresponds to the view in FIG. 22G with the lid 18 in the updated position.

As shown in FIG. 23A, moving the lid 18 linearly forward causes the second arm 58 to move linearly outward as the pin 132 continues to follow the guide way 152 on the lid 18. This in turn causes the valve rib 138 on the second arm 58 to push the valve rod 40 forward due to abutment against the rearward camming surface 146 on the valve actuator 42.

As is visible in FIG. 23C, this causes the valve rod 40 to be inserted further into the valve chamber 28, thereby starting to bring the reaction chamber channel port 315 and the LFS channel entry port 319 into fluidic communication with each other so that a flow path between the reaction chamber and the LFS chamber 26 housing the LFS 8 is established. In the embodiment shown in FIG. 19B, this flow path currently remains sealed by the LFS valve 322.

At this stage, the click arms 609 are once again bent outward by the click arm ramps 156 on the lid 18 and continue to abut against the click arm ramps 156 and resist movement of the lid 18.

Meanwhile, the linearly outward movement of the second arm 58 also allows the rotary member 54 to slowly rotate anticlockwise with the motion of the second arm 58 due to the angled/sloped abutment between the rib 122 on the rotary member 54 and the stop 140 on the second arm 58, as shown in FIG. 23B. However, this rotation of the rotary member 54 does not cause the pistons to move. Instead, the pin 52 follows the arced portion 55 (visible in FIG. 23E) of the slot 50, which allows the rotary member 54 to rotate without moving the pistons. As a result, no liquid transfer occurs between the chambers during this stage. As the rotary member 54 rotates, the abutments 110 and 112 are engaged with the axial fingers 86 and 88 on the retaining member 66 and subsequently rotate the retaining member 66 towards the edges of apertures 78 and 80. The retaining member 66, and subsequently the rotary member 54, are now angularly fixed relative to the chassis 62 by the engagement of those fingers with the chassis at the edge of apertures 78 and 80. At this point the rib 122 and the stop 140 on the second arm 58 can disengage and the rotary member 54 will be prevented from any further rotation.

Figure 24G:
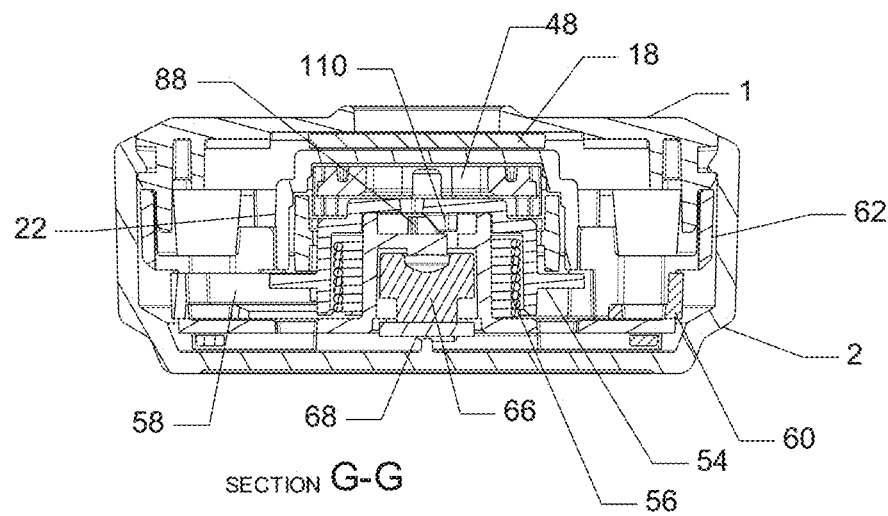
Figure 24H:
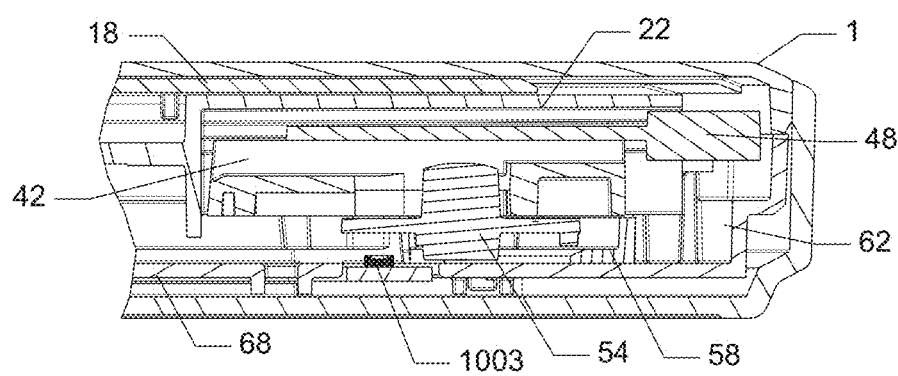
FIG. 24H is a sectional view along the line H-H of FIG. 15, also showing the device when the lid is in the fifth position.

The user then continues to move the lid 18 forward into the configuration shown in FIGS. 24A-24H, which corresponds to the configuration of the device shown in FIG. 16C, i.e. with the lid 18 in the closed position. The views in FIGS. 24A-24G correspond to those in FIGS. 22A-22G respectively with the lid 18 moved to the closed position. FIG. 24H shows a cross-sectional view of the device through section line H-H of FIG. 15.

At this stage, the cap 16 seals down on the sample receiving chamber 24, as shown in FIG. 24C. This may occur due to the lid 18 being resiliently biased toward the sample receiving chamber 24, or it may occur with assistance from the user. As shown in FIG. 24A, the click arms 609 engage with second grooves 1001 on the lid 18, which are shaped to prevent the lid 18 being reopened through abutment against the click arms 609.

As the lid 18 is moved forward, the pin 132 continues to follow the guide way 152 on the lid 18, which causes the second arm 58 to move further outward. This movement of the second arm 58 continues to push the valve rod 40 further into the valve chamber 28 into its final position (shown in FIG. 24C), and it also causes the rib 122 on the rotary member 54 and the stop 140 on the second arm 58 to disengage, thereby fully releasing the rotary member 54, as shown in FIG. 24B.

With the lid 18 in the closed second position (final position), the valve rod 40 is now fully inserted into the valve chamber 28 such that the reaction chamber channel port 315 and the LFS channel entry port 319 are now fully open and in fluidic communication with each other, thereby coupling the LFS chamber 26 to the reaction chambers 36, 38 via the reaction chamber channel port 315 and LFS channel 317 (and associated ports), as shown in FIG. 24C. In the embodiment shown in FIG. 19B the flow path between the LFS chamber 26 and reaction chambers 36, 38 currently remains sealed by the LFS valve 322.

As shown in FIG. 24F, the switch tab 158 on the lid 18 disengages with the activation switch 623 as the lid 18 is moved forward, thereby releasing/opening the activation switch 623. This may in turn cause an indication to be displayed to the user, such as a flashing green LED indicating the device is active. If the activation switch 623 closes and opens too quickly (i.e. the user moves the lid 18 too quickly) another indication may be displayed to the user (such as a red LED) to indicate an error has occurred and the device can otherwise cease to function. This is a failsafe mechanism to ensure that the fluid has sufficient time to flow between the sample receiving and reaction chambers as the user actuates the lid 18. The duration for which the activation switch 623 is closed can be determined using the timer that was started when the activation switch 623 was first closed.

A proximity sensor 1003, shown in FIG. 24H, is used to detect the position of the rotary member 54. In FIG. 24H, the proximity sensor 1003 can be used to detect that there is no obstruction within e.g. 2 mm of the sensor.

If the reagent heating element has not already been activated to heat the solution in the reaction chambers 36, 38 (for example when the activation switch 623 was initially closed) it would now be activated according to a timer or by the activation switch 623 reopening. The heater is controlled to a predefined temperature optimised for the performance of the reaction. When a certain temperature is reached a timer is then triggered which controls a heating period in the device during which a reaction occurs. The actual duration of the timer will depend on the diagnostic test being performed, but this could be on the order of 1-20 minutes for example.

When the reaction timer has completed it is turned off and the heating element on the tip 94 of the PCB is turned on.

As the heat from the heating element on the tip 94 of the PCB melts the bottom surface (melt surface) of the retaining member 66, the sloped engagement between the abutments 110 and 112 and the fingers 86 and 88 pushes the retaining member 66 down against the heating element. Thus, as the retaining member 66 melts and decreases in height, the resilient bias on the rotary member 54 provided by the spring 56 causes the sloped face to press the un-melted portion of the retaining member 66 against the heating element. The rotary member 54 rotates slightly as the retaining member 66 melts.

The retaining member 66 is preferably formed from a thermoplastic material with a low melting point such as polycaprolactone or a cyclic/cyclo olefin polymer or copolymer, and is selectively melted to mechanically release the rotary member 54 when required.

Once the retaining member 66 is sufficiently melted, the retaining member and the rotary member 54 disengage (due to the fingers 86 and 88 no longer being engaged with the abutments 110 and 112) and the rotary member 54 is free to rotate, as shown in FIGS. 25A-25H.

Figure 25G:
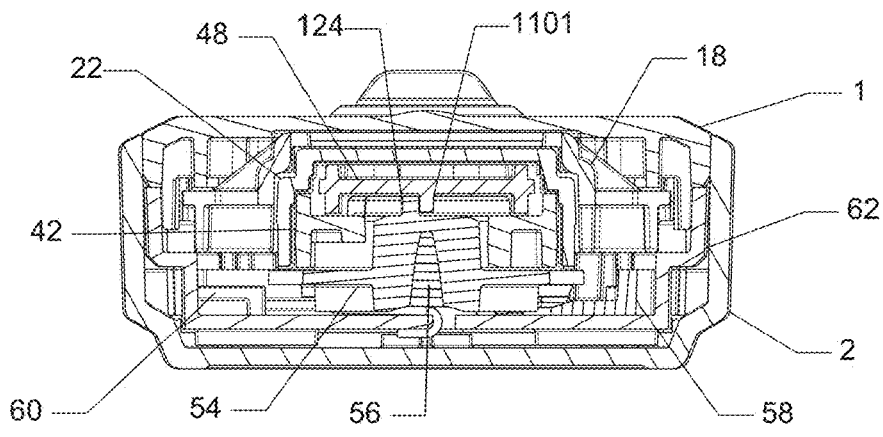
Figure 25H:
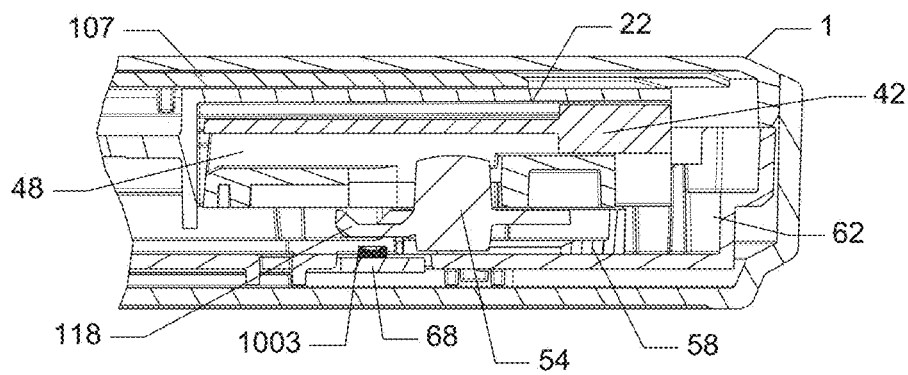
Figure 25I:
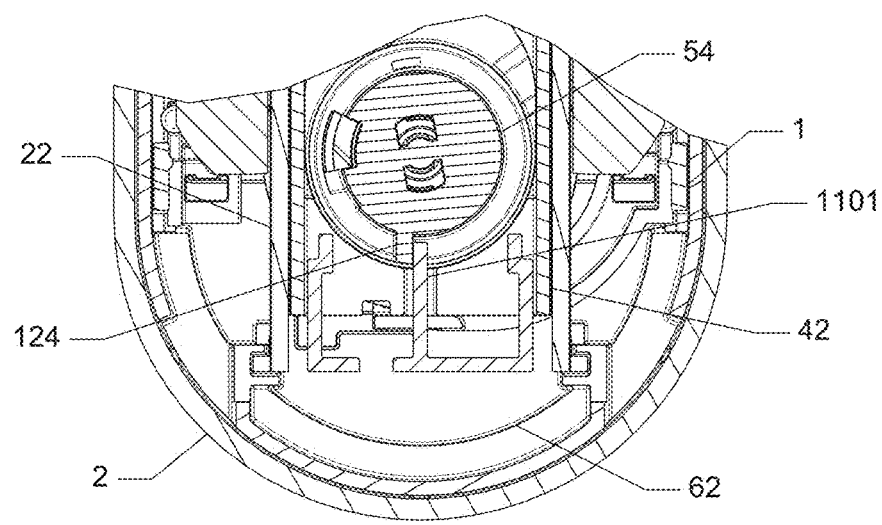

The views in FIGS. 25A-25E correspond to those in FIGS. 24A-24E respectively but with the retaining member 66 melted, the view in FIG. 25F corresponds to that in FIG. 24G, the view in FIG. 25H corresponds to that in FIG. 24H, FIG. 25G shows a cross-sectional view through section line I-I of FIG. 15 and FIG. 25I shows a cross-sectional view through section line L-L of FIG. 15.

As most visible in FIG. 25E, the rotary member 54 rotates anticlockwise until the pistons are fully inserted into the piston chambers 32 and 34 (i.e. the pistons return to their original positions). Further rotation of the rotary member 54 is then prevented by the abutment of the rib 124 on rotary member 54 against a rotary member blockage 1101 on the piston actuator 48, shown in FIG. 25G and FIG. 25I.

No further movement of the valve rod 40 occurs, such that the LFS chamber 26 remains fluidly connected to the reaction chambers 36, 38 via the valve chamber 28. Driving the pistons into the piston chambers 32 and 34 therefore results in pressure differential between the reaction chambers 36, 38 and the LFS chamber 26, which causes the heated solution in the reaction chambers 36, 38 to flow to the LFS chamber 26 (and so to the LFS 8). In the embodiment shown in FIG. 19B, this pressure differential opens the LFS valve 322 allowing the solution in the reaction chambers 36, 38 to flow to the LFS chamber 26. The process by which the solution is driven out of the reaction chambers 36, 38 is essentially the reverse of that by which solution was drawn into the reaction chambers 36, 38 as described above, except that the reaction chambers 36, 38 are now fluidly connected to the LFS chamber 26 rather than the sample receiving chamber 24.

As the volume of all of the chambers is fixed and known and the magnitude of movement of the pistons 44 and 46 are predetermined by the arrangement of the rotary member 54 and pistons, the volume of solution that is transferred from the reaction chambers 36, 38 to the LFS chamber 26 is also a predetermined quantity.

Rotation of the rotary member 54 additionally causes the proximity switch actuator 118 on the rotary member 54 to obscure the proximity sensor 1003 on the PCB 68, thereby reflecting light emitted by the proximity sensor 1003 back onto the proximity sensor 1003. The resulting signal from the proximity sensor 1003 indicates that the solution has been successfully moved to the LFS 8, which triggers the start of a timer while the results develop. Once the timer is complete, an indication may be displayed to the user, such as a blue LED being activated (e.g. instead of a green pulsing LED as described earlier). The actual duration of the timer will depend on the diagnostic test being performed, but this could be on the order of 1-20 minutes for example.

Upon receiving the indication that the timer (and therefore the test) is complete, the user can read the LFS 8 through the label 6 to obtain the test result. The LFS 8 is a testing strip and may typically comprise printed lines or an affinity bioreagent such as an oligonucleotide or an antibody such that it interacts with the reagent solution from the reaction chambers in a known way. If a biomolecule to be detected was present in the sample, the LFS 8 provides a visual indication at the relevant line which can be read through the label 6.

Figure 26A:
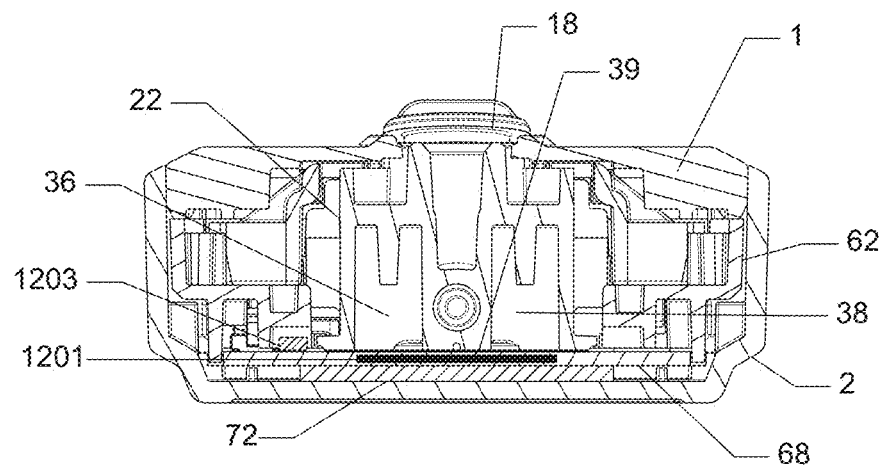
FIG. 26A is a section along the line J-J of FIG. 15, showing the device when the lid is in the fifth position, and shows a reagent heating element.
Figure 26B:
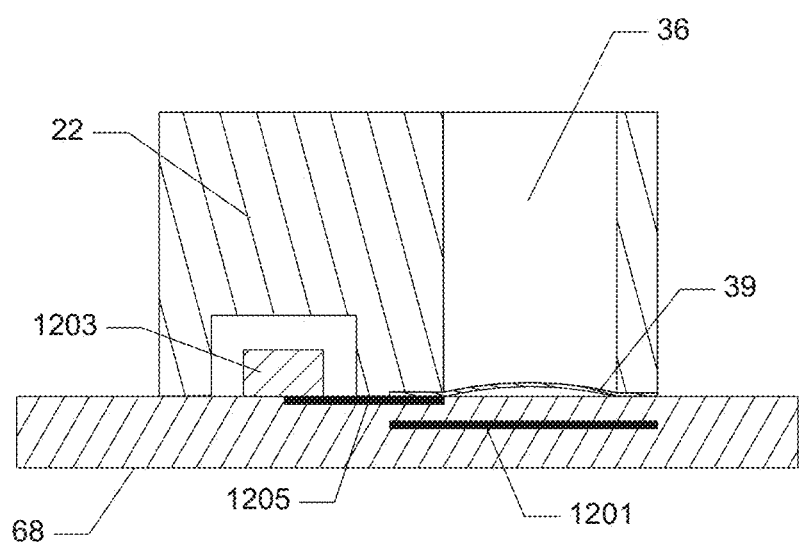
FIG. 26B is a more detailed view of the reagent heating element.
Figure 27:
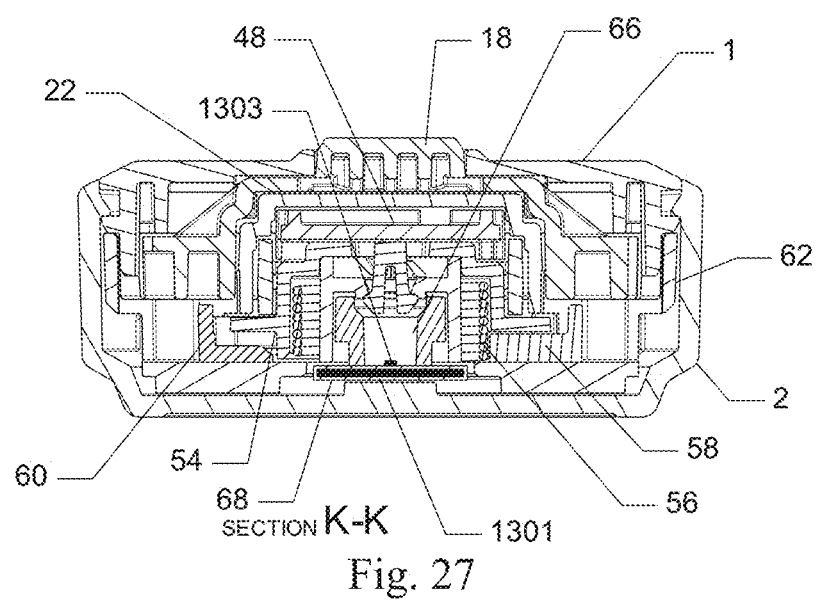
FIG. 27 is a sectional view along the lines K-K of FIG. 15, showing a second heater, for at least partially melting the thermoplastic retaining member or catch.

As described above, both the reagent solution and the retaining member 66 are heated by heating elements on the PCB 68. FIGS. 26A, 26B and 27 show the arrangement of these heating elements in more detail.

The position of the reagent heating element 1201 can be seen in FIGS. 26A and 26B, which show cross-sections of the device through section line J-J of FIG. 15. The reagent heating element 1201 is preferably formed as one or more heater coils made from a long track directly on the PCB 68 (i.e. the reagent heating element 1201 is not a separate component).

As visible from FIG. 26A, the reagent heating element 1201 is positioned directly below both reaction chambers 36, 38. The lower surfaces of the reaction chambers 36, 38 are sealed with the chamber foil 39, which is preferably an aluminium foil layer bonded to the chamber. This also preferentially forms at least one surface of the transfer channels between various chambers.

The heater foam pad 72 is positioned below the reagent heating element 1201 between the lower casing half 2 and the PCB 68. While the lower casing half 2 and/or the chassis 62 may be shaped to guide the PCB 68 into the correct position, the PCB 68 is preferably a floating component rather than fixed to the casing or chassis. The PCB 68, and therefore the reagent heating element 1201, are pushed against the chamber foil 39 by the heater foam 72, thereby ensuring good thermal contact between the reagent heating element 1201 and the chamber foil 39 regardless of manufacturing tolerances.

A temperature sensor 1203 is positioned on PCB 68 in proximity to the reagent heating element 1201. As shown in FIG. 26B, which shows a simplified close-up of the reagent heating element 1201 under one reaction chamber, a copper pad 1205 on the top of the PCB 68 probes the underside of the chamber foil 39 and is connected directly to the temperature sensor 1203. This arrangement allows a close approximation of the temperature of the liquid in the reaction chamber to be determined without requiring a temperature sensor to be positioned within the liquid or using a heat block (both of which would be impractical and expensive in a disposable device).

The heater coils of the reagent heating element 1201 are designed to reach past the nominal internal edge of the reaction chamber to also cover the area of the chamber foil 39 on either side where the foil is supported by the chamber block 22. This removes the requirement to have a well-supported or flat surface to the chamber foil 39 in the area directly below the chamber to attain good heating performance, as the heat transfers laterally/sideways across the chamber foil 39.

As shown in FIG. 26B, an air pocket can form between the chamber foil 39 and the reagent heating element 1201. However, this has a negligible impact on the heating time due to the rapid lateral/sideways transfer of heat across the chamber foil 39 from areas where there is good thermal contact between the chamber foil 39 and reagent heating element 1201.

In the exemplary device shown in FIG. 26B, the heater coils of the reagent heating element 1201 are on at least one inner board layer of a multi-layer PCB 68, which in principle would be expected to result in reduced heat transfer compared to having heater coils positioned on an outer/top board layer. However, this arrangement allows for improved control of the coil resistance due to the process by which the copper is laid down during manufacture of the PCB 68 (the coils are rolled-annealed rather than electroplated as they would be if they were on an outer layer). This therefore allows the internal resistance of the battery 70 to be closely matched in order to ensure maximum power transfer, i.e. the device can be more closely tuned, which results in improved performance and allows the use of a lower-power power source, thereby reducing manufacturing costs.

Referring now to FIG. 27, which shows a cross-sectional view of the device through section line G-G of FIG. 15, reference numeral 1301 denotes a heating element which is positioned directly below the retaining member 66, at the tip 94 of the PCB 68. As with the reagent heating element 1201, the heating element 1301 is integrated into the PCB 68 rather than a separate component. The heating element 1301 is formed from one or more resistive heater coils made from a long spiral track directly on or within the PCB 68. In addition, there is a temperature sensor 1303 positioned on PCB 68 in the centre of the heating element 1301 and retaining member 66. As described above, the interaction between the rotary member 54 and the retaining member 66 means that the retaining member 66 is pressed against the heating element 1301 by the rotary member 54 during melting of the retaining member 66, thereby ensuring good thermal contact between the heating element 1301 and the melt surface of the retaining member 66.

As is clear from the above description, the diagnostic device according to the present invention provides a simple, quick, and effective way to test patients for a disease. A sample is taken from the user and placed in the sample receiving chamber 24 (potentially mixed with another liquid such as a buffer solution). The sample could be taken by the patient, or by another person such as a medical professional.

Once the sample has been placed in the sample receiving chamber 24, the user of the device (which could be the patient or another person such as a medical professional) actuates the lid 18 forward to the position shown in FIG. 16B, which causes a predetermined volume of the liquid sample to be transferred to the reaction chambers 36, 38 and activates the reagent heating element 1201 to heat the reagent solution.

The user then continues to actuate the lid 18 forward to the position shown in FIG. 16C, which connects the reaction chambers 36, 38 to the LFS chamber 26 (in the embodiment shown in FIG. 19B the flow path between the LFS chamber 26 and reaction chambers 36, 38 remains sealed by the LFS valve 322). Following a pre-determined time the reagent heater is turned off and the device activates the heating element 1301 to melt the retaining member 66. Once the retaining member 66 has melted sufficiently, the rotary member 54 is released and drives the pistons forward, thereby causing a predetermined volume of the reagent solution to be driven from the reaction chambers 36, 38 into the LFS chamber 26 (i.e. to the LFS 8).

A timer in the device is then further activated by the proximity sensor 1003 to countdown to completion of the analysis, at which point an indication is displayed to the user to indicate that the analysis is complete and the result can be read from the LFS 8. The diagnostic device can then be disposed of appropriately, for example it might be treated as medical waste and incinerated.

Using this device means there is no need to send a liquid sample to a laboratory, meaning the test can be performed immediately once the sample has been taken. As the patient and the device are preferably in the same location, the test result can be communicated to the patient as soon as the device indicates the test has been completed. As the device controls the flow and heating of liquids (i.e. a predetermined volume of the sample and reagent solutions is transferred between the chambers, and the reagent solution is heated to a predetermined temperature), the test can be performed accurately with minimal user input. The nature of the arms 58 and 60 and the guide ways 150 and 152 means that the device is not particularly sensitive to the speed at which the lid 18 is moved, meaning the device requires very little skill to operate and could be used outside of dedicated testing or healthcare settings or for at-home testing by distributing it to a patient, for example through the post.

Additionally, as there are no complex components such as motors or similar driving the pistons etc, the device can be manufactured relatively cheaply, making it ideal for mass testing, such as during a pandemic or for widespread seasonal infections such as influenza. Many of the parts can be made of relatively cheap and easily obtainable plastics, and the PCB 68 can be mass produced at relatively low cost. In addition, testing using the diagnostic device of the present invention does not require skilled laboratory technicians or expensive laboratory equipment.

The diagnostic device can be adapted to test for different diseases as needed by selecting an appropriate reagent bead and lateral flow strip and programming the PCB 68 (or more specifically, a processing device of the PCB 68) with suitable timings and heating temperatures (e.g. reagent heating temperature and/or duration). In addition, the volume of fluid drawn into the chambers can be adjusted by selecting appropriate values for the piston size and magnitude of movement. The device could also be used for testing purposes other than diseases, for example other biological and chemical tests.

While the diagnostic device described above illustrates one example of the invention, it should be understood that alternative embodiments are also envisaged, and this exemplary device should not be construed as limiting. Individual features of the diagnostic device described above may be used independently in other embodiments of the device of the invention.

For example, the device could be modified to have separate bead chambers and reaction chambers. In addition, alternative cam mechanisms which allow for additional/different sequencing of the filling/emptying of chambers could be implemented, such as designs involving injecting liquid into the reaction/bead chamber under positive pressure for enhanced mixing of the reagents and the liquid sample.

Other potential variations include designs where the valve is formed from two parallel shafts either side of a central piston, which may allow for an improved layout with regard to dead volumes/functionality.

In addition, the device might be modified such that the sequence of fluid transfers allows for the sample to be preheated in the sample receiving chamber or another chamber prior to mixing with the reagents.

In the embodiment described above once the analysis is complete the result can be read from a lateral flow strip. However other methods of presenting the results of the analysis are envisaged, such methods preferably report the presence of the biomolecule in the sample differentially from other components in a sample and from reagents. The detection method may be qualitative or quantitative. The detection may give a visual read out of the results as with the lateral flow strip, it may for example be colorimetric or fluorometric. Alternatively, the presence of a biomolecule may be detected electrically, such as by a change in impedence or a change in conductimetric, amperometric, voltammetric or potentiometric signal.

The device may be used for simultaneously analysing a plurality of biomolecules in a liquid sample, it may also be used for performing a process control during the analysis.

One skilled in the art will understand that other modifications could also be made, such as using a different battery/cell, using multiple printed circuit boards in place of a single printed circuit board assembly, using a single reaction chamber and/or a single piston, combining/swapping one or more of the functions of the first and second arm, adding additional arms etc. These variations are merely given as examples, and numerous other variations are also possible without departing from the scope of the invention.

EXAMPLE 1

Detection of Genomic RNA from the Pathogen SARS-CoV-2 In a Liquid Sample

Figure 28:
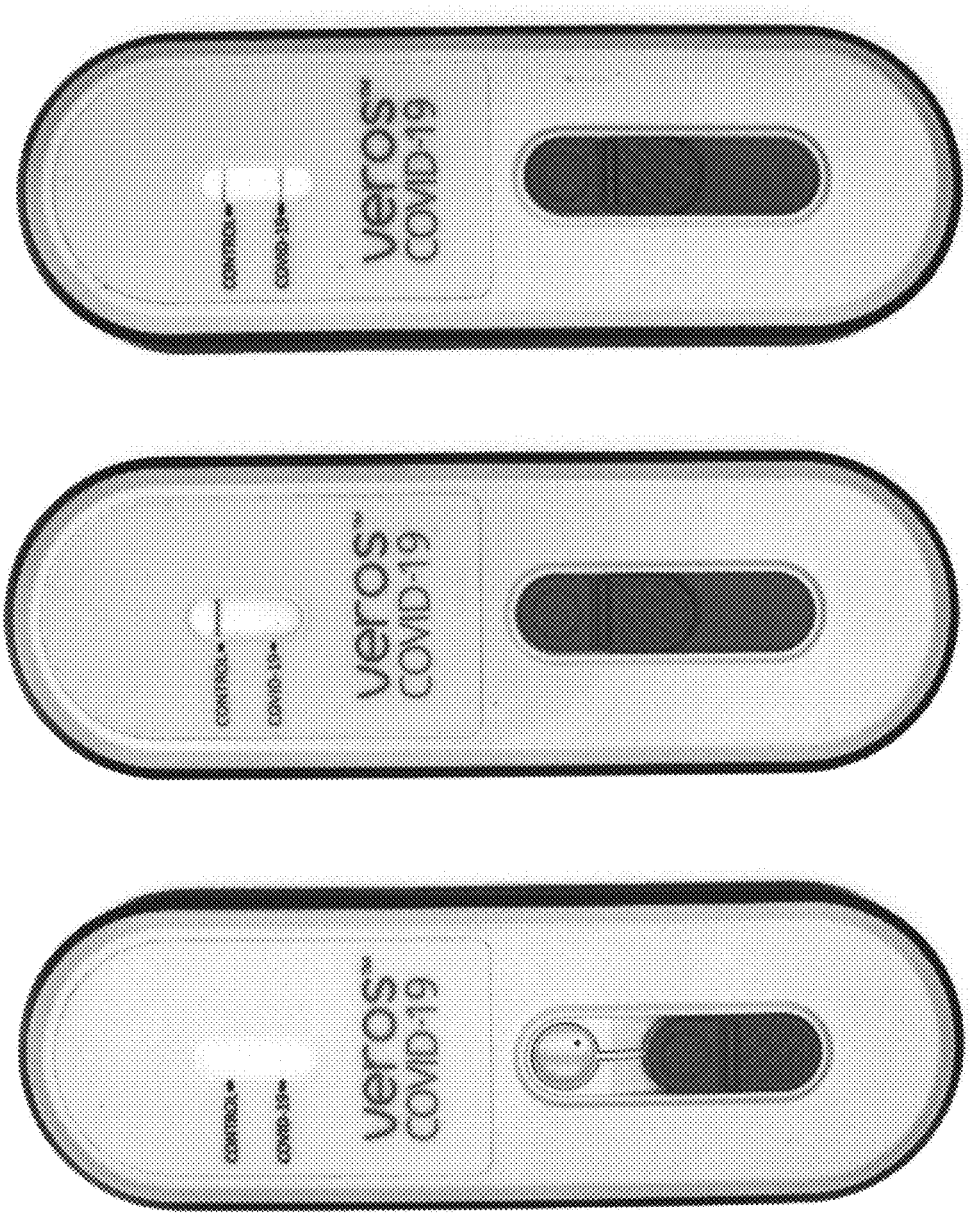
FIG. 28 shows are photographs of a device in accordance with the invention in plan view showing the device prior to use (left), and after use with a negative test result (middle) and a positive test result (right) as described in Example 1.

This example describes the use of devices and methods according to the invention for detecting the presence of SARS-CoV-2 which is a single-stranded RNA virus and causes coronavirus disease 2019 (COVID-19). FIG. 28 (left) shows a plan view of a device prior to use. The devices were pre-loaded with reagents in the form of lyophilised beads for performing nucleic acid amplification and detection, and also with reagents comprising a single-stranded control nucleic acid to perform a process control.

One device was loaded and actuated as described above with reference to FIGS. 1 to 27 with 200 µl of a liquid sample containing copies of genomic RNA from SARS-CoV-2, another device was loaded and actuated in the same way with a corresponding liquid sample which did not contain genomic RNA from SARS-CoV-2 to act as a process control. 15 min after actuation the results of the analyses were visible through the label of the device. FIG. 28 (right) shows the positive test result indicated by the line for COVID-19 obtained from the sample containing genomic RNA from SARS-CoV-2. FIG. 28 (middle) shows a negative test result indicated by no line for COVID-19 from the process control sample which did not contain genomic RNA from SARS-CoV-2. In both cases a line was visible for the process control indicating the accurate functioning of the device and the method. This example demonstrates that the invention is capable of highly sensitive and specific detection and discrimination of biomolecules in a liquid sample and as such represents an advance in the field of biological analysis diagnostics particularly as a simple, ultra-rapid, user-centred, low-cost, instrument free diagnostic device and method.

Throughout the specification and the claims which follow, unless the context requires otherwise, the word 'comprise', and variations such as 'comprises' and 'comprising', will be understood to imply the inclusion of a stated integer, step, group of integers or group of steps but not to the exclusion of any other integer, step, group of integers or group of steps. All patents and patent applications referred to herein are incorporated by reference in their entirety.

Further aspects of the invention include the following:

1. A device for use in the analysis of a biomolecule in a liquid sample, the device having a plurality of zones for accommodating at least part of the liquid sample, transfer means for transferring at least part of the liquid sample from one to another of said zones along a respective flow path, mechanically powered drive means for operating the transfer means, flow control means for selectively opening one or more flow path between the zones, and a common actuating member which sequentially controls both the mechanically powered drive means and the flow control means to achieve transfer of at least part of the liquid sample between said zones.

2. A device according to aspect 1, in which the drive means comprises a rotary member.

3. A device according to aspect 2, in which the transfer means has a displacement member which is linearly movable, the rotary member being coupled to the transfer means by a linkage which converts rotational movement of the rotary member into linear movement of the displacement member, to cause one or more transfers between zones under the power of the drive means.

4. A device according to aspect 3, in which the displacement member comprises at least one piston.

5. A device according to aspect 4, in which the piston is one of a pair of such pistons, each movable in a respective cylindrical piston chamber.

6. A device according to any of the preceding aspects, in which the drive means includes biasing means for storing mechanical energy for powering the drive means.

7. A device according to aspect 6, in which the biasing means comprises a mechanical spring.

8. A device according to aspect 7, in which, the biasing means comprises a torsion spring.

9. A device according to any of aspects 6 to 8, in which the biasing means is preloaded.

10. A device according to aspect 9 as dependent from any of aspects 3 to 8, in which the biasing means is preloaded with sufficient energy to cause movement of the displacement member along two, opposite linear strokes.

11. A device according to any of the preceding aspects, in which the plurality of zones comprises a sample receiving means through which the sample is introduced into the device, a reaction chamber in which the sample undergoes one or more reactions specific to the analysis and a test region for subsequently analysing the reacted sample.

12. A device according to aspect 11, in which the sample receiving means comprises a sample receiving chamber.

13. A device according to aspect 12, which includes a cap or cover for closing the sample receiving chamber during the operation of the device.

14. A device according to aspect 13, in which the common actuating member comprises the cap or cover for closing the sample receiving chamber.

15. A device according to any of the preceding aspects, in which the device includes a heater for heating at least part of the liquid sample.

16. A device according to aspect 15, in which the heater is an electric heater forming part of a printed circuit board (PCB).

17. A device according to aspect 16 in which the PCB also carries control electronics for the device.

18. A device according to any of aspects 15 to 17, in which the heater is thermally coupled to a reaction chamber and the analysis includes the step of heating at least part of the liquid sample in the reaction chamber.

19. A device according to aspect 18, in which the reaction chamber is at least partially defined by a thermally conductive material, such as a foil, for example a metallic foil, e.g. aluminium foil.

20. A device according to aspect 19, in which the device includes biasing means for urging the heater against the thermally conductive material.

21. A device according to any of aspects 18 to 20, in which the heater and the thermally conductive material extend beyond the reaction chamber.

22. A device according to any of aspects 18 to 21, in which the device includes a temperature sensor thermally coupled to the reaction chamber.

23. A device according to any of the preceding aspects, in which the device includes retaining means for temporarily interrupting the operation of the drive means so as to delay the completion of the operation of the transfer means for a period.

24. A device according to aspect 23, in which the retaining means comprises a thermoplastic retaining member for engaging, and acting as a stop to, the drive means and a heater for heating the thermoplastic retaining member, causing the latter to soften or melt, so as to release the drive means therefrom after said period.

25. A device according to aspect 24, in which the retaining means comprises a thermoplastic catch.

26. A device according to any of the preceding aspects, in which the actuating member is movable along a single actuating member stroke, the device being arranged for this single movement to cause the device to perform a predetermined sequence of operations to achieve said analysis of the sample.

27. A device according to aspect 26, in which the actuating member is linearly movable, to perform said stroke.

28. A device according to any of the preceding aspects, in which the actuating member is manually operable by a user of the device.

29. A device according to any of aspects 11 to 28, in which the sequence of operations of the device comprises the transfer of at least part of the liquid sample from the sample receiving means to the reaction chamber along a flow path through the flow control means, where it undergoes one or more reactions and subsequently transferring reacted sample from the reaction chamber to the test region along another path through the flow control means.

30. A device according to any of the preceding aspects, in which the flow control means comprises a valve.

31. A device according to aspect 30, in which the valve includes a rod linearly movable in a valve chamber to bring selective pairs of ports into fluid communication, so as to create said one or more flow paths.

32. A device according to any of aspects 11 to 31, in which the device includes a detent that resists movement of the actuating member beyond a position part way along said stroke, at which position a flow path has been established by the flow control means between the sample receiving means and the reaction chamber and the operation of the transfer means to transfer the sample into the reaction chamber has been triggered, but before completion of the stroke at which position a flow path between the reaction chamber and the test region has been established by the flow control means.

33. A device according to any of aspects 11 to 32, in which the test region comprises a lateral flow strip.

34. A device according to any of the preceding aspects, in which the device includes monitoring means for monitoring the operation of the device and providing a warning if incorrect operation is detected.

35. A device according to any of the preceding aspects which is a disposable, one shot device.

36. A method for the analysis of a biomolecule in a liquid sample comprising introducing the liquid sample into a device according to any of the preceding aspects and actuating the common actuating member.

37. A device comprising:
a resiliently biased latch member;
a thermoplastic retaining member having at least one engagement surface configured to engage with and act as a stop to the latch member; and
a heating member positioned in proximity to the thermoplastic retaining member,
wherein activation of the heating member softens at least a portion of the thermoplastic retaining member to release the latch member.

38. The device according to aspect 37, wherein the engagement surface is sloped such that the engagement between the engagement surface and the latch member presses the thermoplastic retaining member towards the heating member.

39. The device according to aspect 37 or 38, wherein the latch member comprises a sloped engagement surface such that the engagement between the engagement surface of the thermoplastic retaining member and the latch member presses the thermoplastic retaining member towards the heating member.

40. The device according to any of aspects 37 to 39, wherein the thermoplastic retaining member has a softening or melting temperature of between 40° C. and 150° C.

41. The device according to any of aspects 37 to 40, wherein the thermoplastic retaining member comprises polycaprolactone or a cyclic/cyclo olefin polymer or copolymer.

42. The device according to any of aspects 37 to 41, wherein the heating member is an element of a printed circuit board (PCB).

43. The device according to any of aspects 37 to 42, further comprising a temperature sensor in thermal contact with the PCB.

44. The device according to any of aspects 37 to 43, wherein the device is configured to soften the thermoplastic retaining member and thereby to release the latch member after a controlled period.

45. The device according to any of aspects 37 to 44, wherein release of the latch member releases stored mechanical energy, for example stored mechanical energy in a preloaded biasing means such as a mechanical spring, e.g. a torsion spring.

46. The device according to any of aspects 37 to 45, wherein release of the latch member causes a drive means to transfer a liquid.

47. The device according to aspect 46, wherein the drive means transfers the liquid between different zones in the device.

48. A medical device comprising:
a chamber adapted to contain a liquid, at least part of said chamber being defined by a thermally conductive material; and
a multilayer printed circuit board (PCB) comprising a heater;
wherein the thermally conductive material forms an interface between the chamber and the PCB.

49. A medical device according to aspect 48, wherein the PCB also comprises control electronics for the device.

50. The medical device according to aspect 48 or 49, wherein the heater is on an inner layer of the PCB.

51. The medical device according to any of aspects 48 to 50, wherein the heater comprises a trace coil, e.g. a copper trace coil.

52. The medical device according to any of aspects 48 to 51, wherein the thermally conductive material is a sheet of thermally conductive material, such as a foil, for example a metallic foil, e.g. aluminium foil.

53. The medical device according to any of aspects 48 to 52, wherein the chamber comprises at least one substantially planar surface which is defined by the thermally conductive material.

54. The medical device according to any of aspects 48 to 53, wherein the interface between the thermally conductive material and the PCB has a larger surface area than the area of the chamber defined by the thermally conductive material.

55. The medical device according to any of aspects 48 to 54, which further comprises a temperature sensor thermally coupled to the chamber.

56. The medical device according to aspect 55, wherein the temperature sensor is located on the PCB and a thermally conductive element, e.g. a copper pad, thermally couples the temperature sensor to the thermally conductive material.

57. The medical device according to any of aspects 48 to 56, which further comprises a temperature controller, such as Proportional Integral (PI) or Proportional Integral Derivative (PID) controller.

58. The medical device of any of aspects 48 to 57, which further comprises biasing means to urge the PCB into contact with the thermally conductive material.

59. The medical device according to aspect 58, wherein the biasing means, e.g. a foam pad, is located between the PCB and a device casing within which the chamber and the PCB are housed; or the biasing means forms an integral part of the device casing.

60. The medical device according to any of aspects 48 to 59, which further comprises an electrical power source, such as a battery or cell, to power the heater.

61. The medical device according to aspect 49 or any of the aspects 50 to 60 as dependent from aspect 49, wherein the electrical resistance of the PCB trace coil is substantially the same as an internal electrical resistance of the power source.

62. The medical device according to any of aspects 48 to 61, which comprises a plurality of chambers at least part of each of which is defined by a thermally conductive material.

63. The medical device according to any of aspects 48 to 62, wherein the thermally conductive material defining at least part of the plurality of chambers is continuous between the plurality of chambers.

64. The medical device according to any of aspects 48 to 63 which is a diagnostic device.

65. The medical device according to any of aspects 48 to 64 wherein the chamber is a reaction chamber or a medicament chamber.

66. The medical device according to any of aspects 48 to 65, wherein the chamber is a nucleic acid amplification reaction chamber.

The invention claimed is:

1. A medical device comprising: a multilayer printed circuit board (PCB) comprising a heating element on an inner layer of the PCB; a single-cell electrical power source to power the heating element; and a chamber adapted to contain a liquid, at least part of the chamber being defined by a thermally conductive material configured to provide a thermal transfer interface between the chamber and the PCB, wherein the interface between the thermally conductive material and the PCB comprises a larger surface area than the area of the chamber defined by the thermally conductive material.

2. The medical device according to claim 1, wherein the PCB also comprises control electronics for the device.

3. The medical device according to claim 1, wherein the heating element is disposed on an inner layer of the PCB.

4. The medical device according to claim 1, wherein the heating element comprises a trace coil.

5. The medical device according to claim 1, wherein the thermally conductive material comprises a sheet of thermally conductive material.

6. The medical device according to claim 1, wherein the chamber comprises at least one substantially planar surface which is defined by the thermally conductive material.

7. The medical device according to claim 1, which further comprises a temperature sensor thermally coupled to the chamber.

8. The medical device according to claim 7, wherein the temperature sensor is located on the PCB and a thermally conductive element thermally couples the temperature sensor to the thermally conductive material.

9. The medical device according to claim 1, further comprises a temperature controller, such as Proportional Integral (PI) or Proportional Integral Derivative (PID) controller.

10. The medical device of claim 1, further comprising biasing means to urge the PCB into contact with the thermally conductive material.

11. The medical device according to claim 10, wherein the biasing means is located between the PCB and a device casing within which the chamber and the PCB are housed.

12. The medical device according to claim 1, wherein the single cell power source comprises a AAA battery.

13. The medical device according to claim 1, wherein the electrical resistance of the heating element within the PCB is substantially the same as an internal electrical resistance of the power source.

14. The medical device according to claim 1, which comprises a plurality of chambers at least part of each of which is defined by a thermally conductive material.

15. The medical device according to claim 14, wherein the thermally conductive material defining at least part of the plurality of chambers is continuous between the plurality of chambers.

16. The medical device according to claim 1, comprising at least one of a diagnostic device and a medical delivery device.

17. The medical device according to claim 1, wherein the chamber comprises at least one of a reaction chamber and a medicament chamber.

18. The medical device according to claim 5, wherein the sheet of thermally conductive material comprises a metallic foil.

19. The medical device according to claim 10, wherein the chamber comprises a nucleic acid amplification reaction chamber, and biasing means forms an integral part of the device casing.

* * * * *

UNITED STATES PATENT AND TRADEMARK OFFICE
CERTIFICATE OF CORRECTION

| | | |
|---|---|---|
| PATENT NO. | : 12,239,983 B2 | Page 1 of 1 |
| APPLICATION NO. | : 18/020692 | |
| DATED | : March 4, 2025 | |
| INVENTOR(S) | : Ralph Lamble | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 178 days.

Signed and Sealed this
Sixth Day of January, 2026

John A. Squires
*Director of the United States Patent and Trademark Office*